United States Patent
Saito et al.

(10) Patent No.: US 6,320,800 B1
(45) Date of Patent: Nov. 20, 2001

(54) SEMICONDUCTOR MEMORY AND NONVOLATILE SEMICONDUCTOR MEMORY HAVING REDUNDANT CIRCUITRY FOR REPLACING DEFECTIVE MEMORY CELL

(75) Inventors: Hidetoshi Saito, Yokohama; Masao Kuriyama, Fujisawa; Yasuhiko Honda, Yokohama; Hideo Kato, Kawasaki, all of (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 09/583,540

(22) Filed: Jun. 1, 2000

(30) Foreign Application Priority Data

Jun. 3, 1999 (JP) .................................................. 11-156255
Mar. 9, 2000 (JP) .................................................. 12-065398

(51) Int. Cl.$^7$ ........................................................ G11C 7/00
(52) U.S. Cl. ..................... 365/200; 365/210; 365/230.06; 365/230.08
(58) Field of Search .................................... 365/218, 210, 365/199, 193, 196, 200, 230.08, 189.05, 230.06

(56) References Cited

U.S. PATENT DOCUMENTS

| | | |
|---|---|---|
| 4,914,632 | 4/1990 | Fujishima et al. . |
| 5,077,691 | 12/1991 | Haddad et al. ........................ 365/218 |
| 5,287,310 | 2/1994 | Schreck et al. .................. 365/189.05 |
| 5,438,546 | 8/1995 | Ishac et al. ............................ 365/200 |
| 5,677,880 | 10/1997 | Horiguchi et al. . |
| 5,689,465 | * 11/1997 | Sukegawa et al. ................... 365/200 |
| 5,867,430 | 2/1999 | Chen et al. ...................... 365/189.04 |

FOREIGN PATENT DOCUMENTS 0 561 131 A2  1/1993  (EP) .
0 745 995 A1  5/1995  (EP) .

OTHER PUBLICATIONS

International Search Report.

* cited by examiner

Primary Examiner—David Nelms
Assistant Examiner—Thong Le
(74) Attorney, Agent, or Firm—Banner & Witcoff, Ltd.

(57) ABSTRACT

Redundant cell arrays 201 of a plurality of columns are provided for replacing a defective bit line of a memory cell array 101. Each of the redundant cell arrays 201 is provided with a redundant sense amplifier circuit 105 separately from a sense amplifier circuit 103 of the memory cell array 101. A defective address storing circuit 108 stores a defective address of the memory cell array 101, an input/output terminal, to and from which data corresponding to the defective address are. to be inputted and outputted, and a column set number of the redundant cell array which is to be replaced in accordance with the input/output terminal. An address comparator circuit 109 detects the coincidence of an input address with the defective address. A switch circuit 112 is controlled by the coincidence detection output to switch one corresponding to the defective address of a sense amplifier circuit to one selected by the set number in the redundant sense amplifier circuit, to connect it to a data input/output buffer 113. Thus, it is possible to provide a semiconductor memory capable of effectively relieving a plurality of defective columns and a defect in a boundary region in column directions of the cell array.

19 Claims, 27 Drawing Sheets

SEMICONDUCTOR MEMORY AND NONVOLATILE SEMICONDUCTOR MEMORY HAVING REDUNDANT CIRCUITRY FOR REPLACING DEFECTIVE MEMORY CELL

RELATED APPLICATION

This application claims the benefit of priority under 35 U.S.C. §119 of Japanese Patent Applications Nos. H11-156255, filed on Jun. 3, 1999, and 2000-65398 filed on Mar. 9, 2000, the entire contents of which are incorporated by reference herein.

BACKGROUND OF THE INVENTION

1. Field of the Invention

The present invention relates generally to an electrically rewritable semiconductor memory, such as an EEPROM. More specifically, the invention relates to a semiconductor memory having a redundant circuit for replacing a defective memory cell.

2. Description of the Related Background Art

In typical large scale semiconductor memories, a redundant circuit system for relieving a device having a certain range of defective memory cells is adopted in order to improve producing yields. The redundant circuit systems include three types, i.e., a column redundant circuit for replacing a defective bit line with a spare bit line, a row redundant circuit for replacing a defective word line with a spare word line, and a combination thereof.

A memory of a redundant circuit system has a defective address storing circuit, such as a fuse circuit, for nonvolatilisably storing a defective address. Then, the coincidence of an input address with a defective address is detected to output an detection output. In response to the coincidence detection output, the memory cell of the defective address is replaced with a memory cell of a redundant circuit.

However, in conventional EEPROMs, the relief efficiency using the redundant circuit is not high Because it is not possible to cope with a plurality of defective columns or rows even if redundant circuits corresponding to one column or one row are arranged at the end portion of a memory cell array. In addition, even if redundant circuits corresponding to one column or one row are arranged at the end portion of the memory cell, there is a strong possibility that the redundant circuits themselves at the end portion of the cell array will be defective. This also lowers the relief efficiency.

SUMMARY OF THE INVENTION

It is therefore an object of the present invention to provide a semiconductor memory capable of effectively relieving a plurality of defective columns and a defect in a boundary region in column directions.

It is another object of the present invention to provide a semiconductor memory of the RWW specification capable of efficiently columns in each bank.

It is a further object of the present invention to provide a semiconductor memory capable of effectively relieving a defective row by preventing any useless pass current paths from being produced in a data erase operation.

It is a still further object of the present invention to provide a semiconductor memory having a defective address storing circuit capable of shortening time in a defect inspection process.

The present invention is effective in the application to EEPROMs as well as other semiconductor memories such as DRAMs.

In order to accomplish the aforementioned and other objects, according to one aspect of the present invention, a semiconductor memory comprises:

a memory cell array having electrically rewritable memory cells; a plurality of redundant column cell arrays for relieving a defective memory cell in the memory cell array;

a decoding circuit for selecting a memory cell of the memory cell array;

a plurality of sense amplifier circuits for detecting read data of the memory cell array and for latching write data;

data input/output buffers provided between each of the sense amplifier circuits and a corresponding one of data input/output terminals;

a defective address storing circuit for storing a defective address of the memory cell array, an input/output terminal to and from which data corresponding to the defective address are inputted and outputted, and a set number for identifying one of the plurality of redundant column cell arrays, which is to be substituted so as to correspond to the input/output terminal;

a plurality of redundant sense amplifier circuits for detecting read data of the plurality of redundant column cell arrays and for latching write data;

an address comparator circuit for outputting a coincidence detection signal when an input address is coincident with the defective address held in the defective address storing circuit; and a switching circuit which is controlled by the coincidence detection signal for selectively connecting one of the sense amplifier corresponding to the defective address in the plurality of sense amplifier circuits or one of the redundant sense amplifier circuits identified by the set number in the plurality of redundant sense amplifier circuit, to the data input/output buffer.

According to another aspect of the present invention, a semiconductor memory comprises:

a memory cell array having electrically rewritable memory cells, the memory cell array being divided into a plurality of banks which are able to be accessed independently of each other;

at least one redundant column cell array provided in each of the banks for relieving a defective memory cell of the memory cell array;

a decoding circuit provided in each of the banks;

a first address bus line for data reading, which is provided commonly for each of the banks;

a second address bus line for data writing or erasing, which is provided commonly for each of the banks;

a first data bus line for data reading, which is provided commonly for each of the banks;

a second data bus line for data writing or erasing, which is provided commonly for each of the banks;

a plurality of first sense amplifier circuits, connected to the first data bus line, for detecting and amplifying read data of the memory cell array in parallel;

a plurality of second sense amplifier circuits, connected to the second data bus line, for detecting and amplifying verify read data of the memory cell array in parallel;

a busy signal circuit, provided in each of the banks, for outputting a busy signal indicating whether an assigned bank is selected as a data write or erase mode or a read mode, the busy signal being used for controlling the selective connection of the first and second address bus lines and for controlling the selective connection of the first and second data bus lines;

a defective address storing circuit for storing an input/output terminal, to and from which a defective address of the memory cell array and data corresponding to the defective address are inputted and outputted;

a first redundant sense amplifier circuit which is provided so as to correspond to the redundant column cell array and which is connected to the first data bus line for detecting and amplifying read data of the redundant column cell array;

a second redundant sense amplifier circuit which is provided so as to correspond to the redundant column cell array and which is connected to the second data bus line for detecting and amplifying verify read data of the redundant column cell array;

a first address comparator circuit for detecting the incidence of an address, which is supplied to the first address bus line in a data read operation, with the defective address held in the defective address storing circuit;

a second address comparator circuit for detecting the coincidence of an address, which is supplied to the second address bus line in a data write or erase operation, with the defective address held in the defective address storing circuit;

a first switching circuit for replacing a part of the output of the plurality of first sense amplifier circuits with the output of the first redundant sense amplifier circuit, on the basis of a coincidence detection output of the first address comparator circuit; and a second switching circuit for replacing a part of the output of the plurality of second sense amplifier circuits with the output of the second redundant sense amplifier circuit, on the basis of a coincidence detection output of the second address comparator circuit.

According to a further aspect of the present invention, a semiconductor memory comprises:

a memory cell array having electrically rewritable memory cells, the memory cell array being divided into a plurality of banks which are able to be accessed independently of each other;

a redundant cell array block provided in each of the banks for relieving a defective memory cell of the memory cell array;

decoding circuits provided in the memory cell array and the redundant cell array block in each of the banks, respectively;

a first address bus line for data reading, which is provided commonly for each of the banks;

a second address bus line for data writing or erasing, which is provided commonly for each of the banks;

a busy signal circuit, provided in each of the banks, for outputting a busy signal indicating whether an assigned bank is selected as a data write or erase mode or a read mode;

an address line switching circuit for connecting one of the first and second address bus lines to the memory array and redundant cell array block of each of the banks, in accordance with the busy signal;

a defective block address storing circuit for storing a defective address of the memory cell array;

a first address comparator circuit for comparing an address, which is supplied to the first address bus line, with the defective block address, which has been held in the defective address storing circuit, in a data read operation to output a first coincidence detection signal when both are coincide with each other;

a second. address comparator circuit for comparing an address, which is supplied to the second address bus line, with the defective block address, which has been held in the defective address storing circuit, in a data write or erase operation to output a second coincidence detection signal when both are coincide with each other; and a hit address switching circuit for causing one of the memory cell array and the redundant cell array block to be active and the other to be inactive, in accordance with the first and second coincident detection, signals, in each of the banks.

According to a still further aspect of the present invention, a semiconductor memory comprises:

a memory cell array having electrically rewritable memory cells, the memory cell array being divided into a plurality of banks which are able to be accessed independently of each other, each of the banks having a plurality of cures, each of the cares comprising a set of blocks, each of which is the minimum unit for data erase;

a redundant cell array block, which has one or more cores provided independently of each of the banks, for relieving a defective memory cell of the memory cell array;

a first decoding circuit provided in the memory cell array in each of the banks;

a second decoding circuit provided in the redundant cell array block;

a first address bus line for data reading, which is provided commonly for each of the banks;

a second address bus line for data writing or erasing, which is provided commonly for each of the banks;

a busy signal circuit, provided in each of the banks, for outputting a busy signal indicating whether an assigned bank is selected as a data write or erase made or a read mode;

a first address line switching circuit, provided in each of the banks, for connecting one of the first and second address bus lines to the memory array of each of the banks, in accordance with the busy signal;

a second address line switching circuit, provided in the redundant cell array block, for connecting the first and second address bus lines to the redundant cell array block;

a defective address staring circuit for storing a defective address of the memory cell array;

a first address comparator circuit for comparing an address, which is supplied to the first address bus line, with the defective block address, which has been held in the defective address storing circuit, in a data read operation to output a first coincidence detection signal when both are coincide with each other;

a second address comparator circuit for comparing an address, which is supplied to the second address bus line, with the defective block address, which has been held in the defective address storing circuit, in a data write or erase operation to output a second coincidence detection signal when both are coincide with each other;

a first core decoder, which is provided in each of the banks and which is activated when the first and second address comparator circuits do not output the coincidence detection signal, for decoding a core address of addresses, which are supplied to the first and second address bus line, to supply the decoded core address to the memory cell array;

a core switching circuit for selecting an output of the first care decoder in accordance with. Ito busy signal outputted from the busy signal circuit, to supply the selected output to the memory cell array; and a second core decoder, which is provided in the redundant cell array block and which is activated when the first and second address comparator circuits output the coincident detection signal, for decoding a core address of addresses, which are supplied to but first and, second address bus lines, to supply the decoded core address to the redundant cell array block.

According to another aspect of the present invention, a semiconductor memory comprises:

a memory cell array having electrically rewritable memory cells, the memory cell array also comprising a plurality of blocks, each of which defines a range of memory cells serving as the minimum unit for data erase;

a redundant cell array for relieving a defective memory cell of the memory cell arrays;

a decoding circuit for selecting a memory cell of the memory cell array;

a defective address storing circuit for storing a defective address of the memory cell array; and an address comparator circuit for detecting the coincidence of an input address with the defective address which has been held in the defective address staring circuit, wherein a defective row of the memory cell array is replaced with the redundant cell array, and the decoding circuit has a row decoder for supplying 0 V to a defective word line, which is a word line corresponding to the defective address, of a block to be erased in a data, erase operation, a negative voltage to other word lines, and 0 V to all of word lines in blocks other than the block to be erased, to allow the defective word line to be replaced every block of the memory cell array According to further aspect of the present invention, a semiconductor memory comprises:

a memory cell array;

a redundant cell array for relieving it defective cell of the memory cell array;

a defective address storing circuit for storing a defective address of the memory cell array; and an address comparator circuit for detecting the coincidence of an input address with the defective address, which has been held in the defective address storing circuit, to replace the defective cell of the memory cell array with the redundant cell array, and wherein the defective address storing circuit comprises:

an electrically storage circuit for electrically holding a defective address found in a certain defect inspecting process; and a fixed storage circuit for transferring and fixedly storing at least part of the defective address after a plurality of defect inspecting processes.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

First Preferred Embodiment

Figure 1:
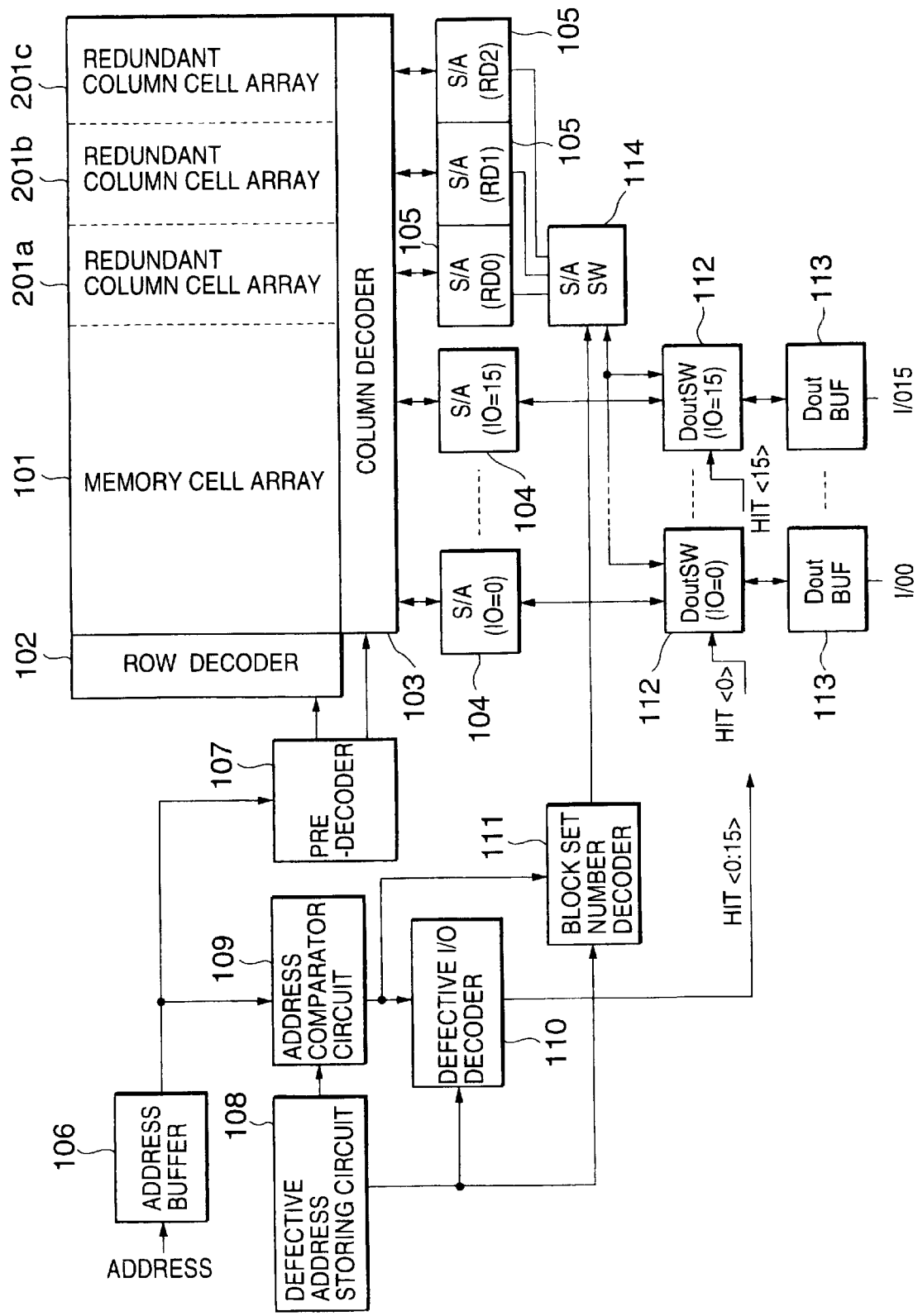
FIG. 1 is a block diagram of a preferred embodiment of an EEPROM bowing redundant column cell arrays according to the present invention.
Figure 2:
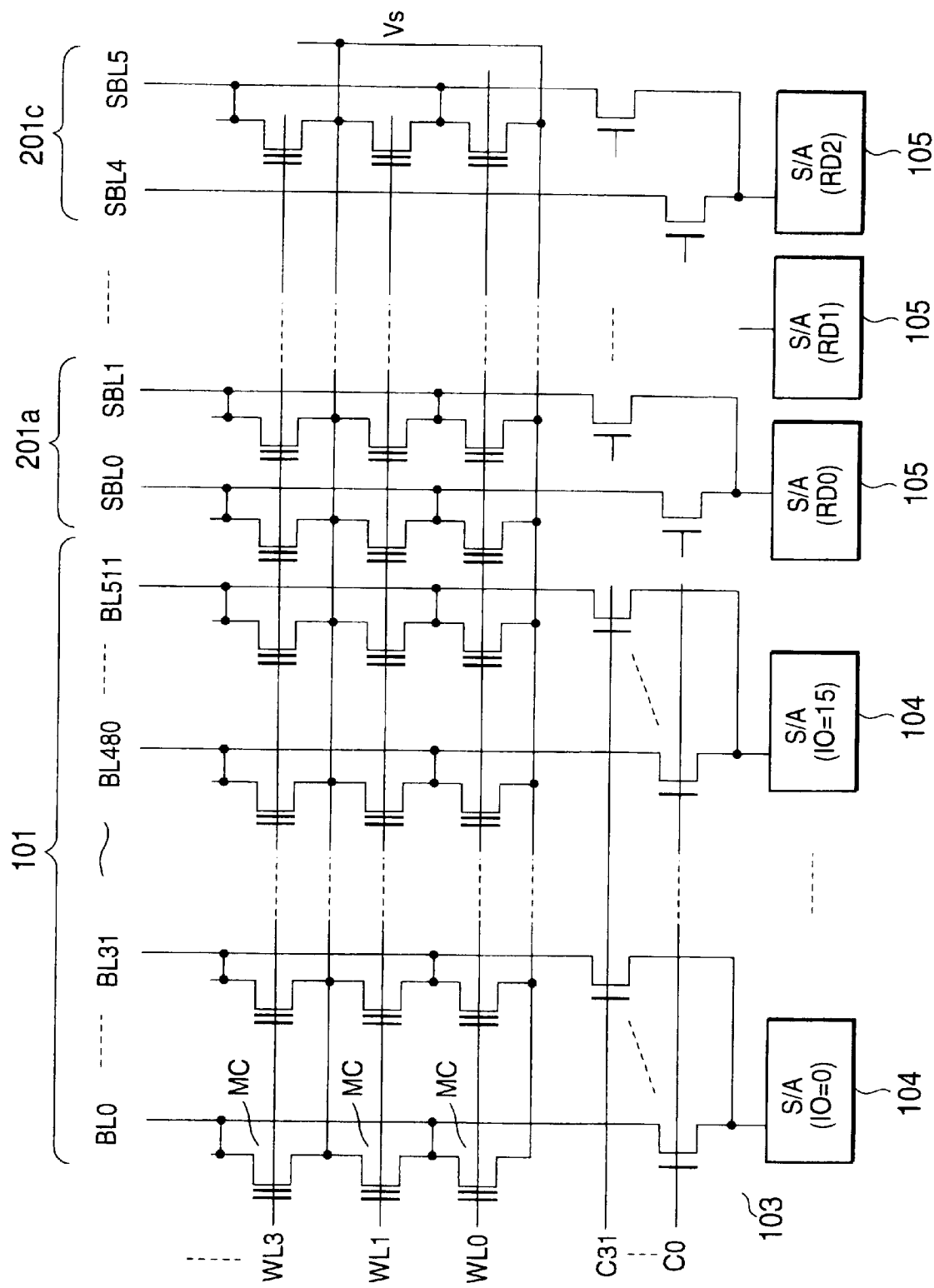
FIG. 2 is a diagram showing the construction of a memory cell array in this preferred embodiment.

FIG. 1 shows the construction of a first preferred embodiment of an EEPROM having a column redundant circuit according to the present invention. A memory cell array 101 comprises a plurality of bit lines BL, a plurality of word lines WL, and a plurality of memory cells MC, each of which is arranged at a corresponding one of the intersections of the bit and word lines, as shown in FIG. 2. Each of the memory cells MC has a MOS transistor structure having a floating gate and a control gate stacked thereon, and is designed to nonvolatilisably store, as binary data, the difference in threshold due to the presence of charge injection into the floating gate. FIG. 2 shows an example of a NOR type EEPROM. Also in preferred embodiments which will be described later, the same memory cell array structure will be used.

In a data write operation in a memory cell of this type, a positive voltage is applied to a selected bit line BL, and a higher positive voltage the n that applied to the bit line BL is applied to a selected word line WL, so that electrons are injected into a floating gate by the hot electron injection. The state that electrons are injected into the floating gate to raise the threshold is, e.g., data "0". In a data erase operation; a range including continuous word lines WL is used as a block serving as the minimum unit for erase, and a negative voltage is applied to all of the word lines WL every block to emit the electrons of the floating gate to a substrate. The state that the electrons of the floating gate are thus emitted to lower the threshold voltage is e.g., data "1".

With respect to addresses acquired by an address buffer 106, a row address and, a column address are decoded, via a pre-decoder 107, by means of a row decoder 102 and a column decoder 103, respectively. By these decode outputs, the word lines selection and bit line selection of the memory cell array 101 are carried out. The bit line data selected by the column decoder 103 are detected and amplified by means of a sense amplifier circuit 104. In a data write operation, the sense amplifier circuit 104 has the function of latching data acquired via a data buffer 113 from an input/output terminal. In the shown embodiment, a 16-bit parallel read/write operation is intended to be carried out, and 16 sense amplifier circuits 104 are provided for 16 input/output terminals to carry out data transfer to 16 bit lines BL.

The usual memory cell array 101 is provided with redundant column cell arrays 201 (201a through 201c), including spare bit lines SBL corresponding to a plurality of columns (three columns in the shown embodiment) in order to replace defective bit lines therein. Redundant sense amplifier circuits 105 are connected to the redundant column cell arrays 201, respectively. A sense amplifier switching circuit 114 is designed to select one of the redundant sense amplifier circuits 105. In addition, each of data switching circuits 112. is provided for switching the selected redundant sense amplifier circuit 105 to one of the 16 sense amplifier circuits 104 to connect it to a data input/output buffer 113.

That is, in this preferred embodiment, data in the redundant column cell arrays 201 and the selected data in the memory cell array 101 are simultaneously read out, and when a defective column is selected, an output switching control for using one of the redundant sense amplifier circuits 105, which is connected to one of the redundant column cell arrays 201, in place of the sense amplifier circuit 104 corresponding to the BMWs column is carried out. For this substitution control, there are provided a defective address storing circuit 108, an address comparator circuit 109, a defective I/O decoder 110 and a block set number decoder 111.

The defective address storing circuit 108 is, e.g., a fuse circuit, and stores a defective column address which has been detected. by a test, data (4 bits in this preferred embodiment) for an input/output terminal, to and from which data corresponding to the detective column address should be inputted and outputted, and a set number (2 bits in this preferred embodiment) in a redundant column cell array 201 which corresponds to the input/output terminal and which should be substituted. The address comparator circuit 109 detects the coincidence of an input address with the defective address which has been held in the defective address storing circuit 108. When the coincidence is detected, the detective IP) decoder 110 decodes an I/O terminal corresponding to the stored defective address on the basis of the detection signal, and outputs hit signals HIT<0:15>. The hit signals HIT<0:15> to mean a set of hit signals HIT<0> through HIT<15>.

Assuming that the three redundant sense amplifier circuits 105 are S/A(RD0), S/A(RD1) and S/A(RD2), it is assumed that the logic of the block set number decoder 111 has 00=S/A (RD0), 01=S/A (RD0), 10=S/A (RD1) and 11=S/A (RD2). By switching the sense amplifier switching circuit 114 in such a logic, it is possible to select one of the redundant sense amplifier circuits 105. At this time, if the logic of the block set number decoder 111 is set so that HIT<15> is 0-fixed at 00, this can be used as an enable bit.

Specifically, the case of block set number "01" will be described as an example. The coincidence of a defective address with an inputted internal address is detected by the address comparator circuit 109. When no coincidence is detected, the output HIT<0:15> of the defective I/O decoder 110 is 0-fixed. At this time, each of the data switching circuits 112 derives the output of the original sense amplifier circuit 104 to transfer the output to the data buffer 113. When the coincidence is detected by the address comparator circuit 109, assuming that the. defect IO terminal information stored in the defective address storing circuit 108, is, e.g., "0101" (=IO5), the hit signal HIT<5> has "1", and the hit signals HIT<0:4> and HIT<6:15> have "0". On the other hand, by the block set number "01", the sense amplifier circuit S/A (RD0) of the redundant sense amplifier circuits 105 is selected. The output of this sense amplifier circuit S/A (RD0) enters the data switch circuit 112 to be selected by the hit signal HIT<5> to be transferred to the data input/output buffer 113. The other data switching circuits 112 of IO=0~4 and IO=6~15 have hit signals HIT<0:4> and HIT<6:15>= "0", so that the output of the original sense amplifier circuit 104 is selected.

As described above, according to this preferred embodiment, each of the redundant sense amplifier circuits 105 is provided for the corresponding one of the redundant column cell arrays 201 for three columns, and 16+3-bit data are simultaneously read out in a data read opertion. Then, the substitution for defective data corresponding to the defective address is carried out by the sense amplifier switching circuit 114 and the data switching circuits 122. Thus, it is possible to relieve a plurality of defective columns. In addition, in this preferred embodiment, the redundant circuits for the plurality of columns are used, so that the relief efficiency is high.

Moreover, in this case of this preferred embodiment, the output output of the redundant column cell array is read out simultaneously with the read-out of normal memory cell data including the defective address, and the read output of the defective column address is switched by the output of the redundant cell array. Thus, the read output of the redundant cell array is not delayed from the read output of the normal cell array.

In addition, the outputs of. the plurality of redundant sense amplifier circuits 105 are switched by the sense amplifier circuit 114 to supply the output of one of the redundant sense amplifier circuits 105 to the data switching circuit 112. That is, the outputs of the redundant sense amplifier circuits 105 are supplied to the data buffer 113 by means of the two-stage switching circuits of the sense amplifier switching circuit 114 and data switching circuits 112 Therefore, the number of buses between. the sense amplifier switching circuit 114 and the data switching circuits 112 can be one. That is, the number of buses between the sense amplifier switching circuit 114 and the data switching circuit 112 can be decreased as compared with when the sense amplifier switching circuit 114 is not provided.

Furthermore, the number of the redundant columns should not be limited to three, but it may be more. In that case, the redundant sense amplifier circuits 105 may be provided for each of the redundant columns to use the circuit system in the above described preferred embodiment.

Second Preferred Embodiment

Figure 3:
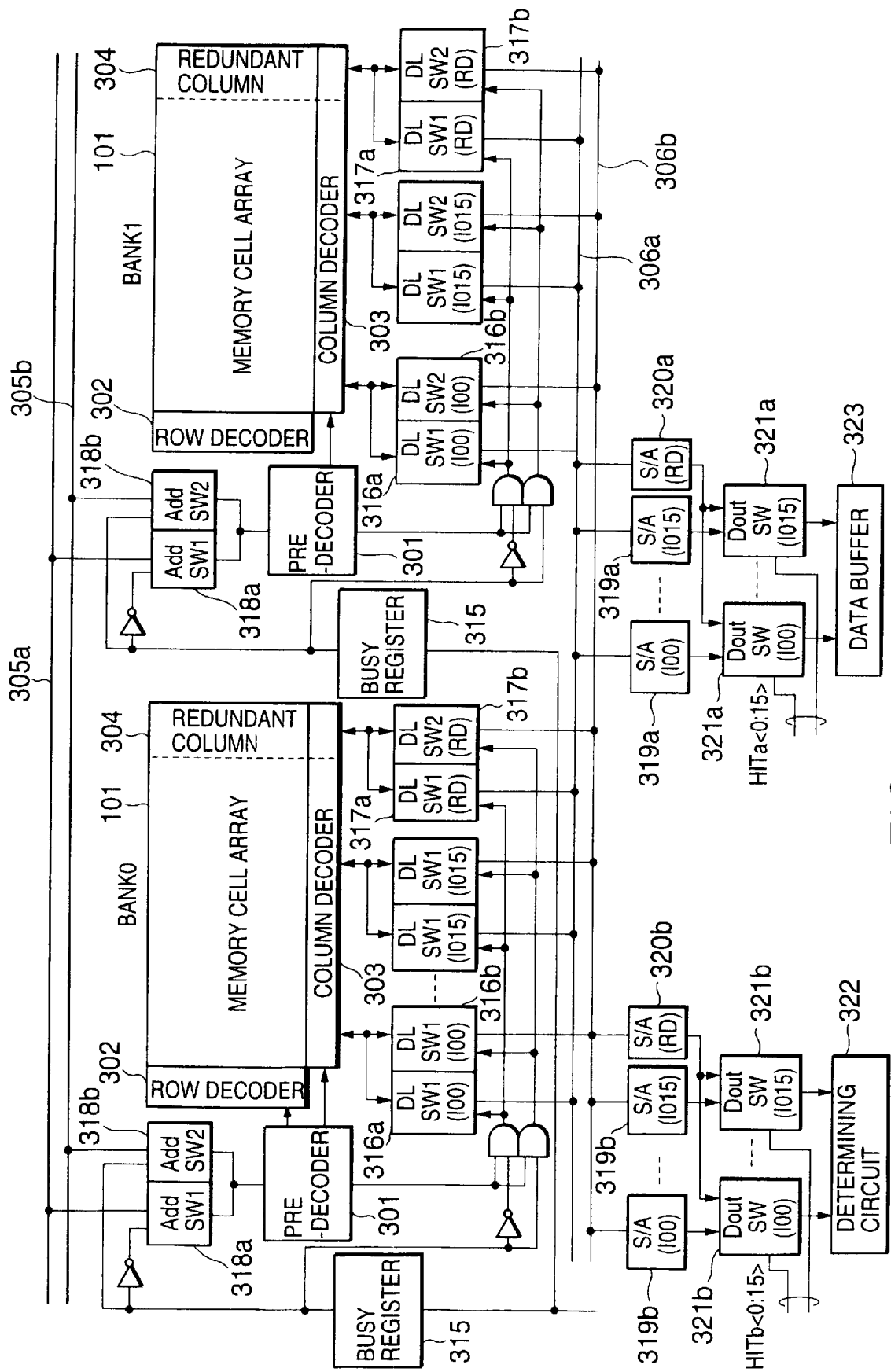
FIG. 3 is a block diagram of a second preferred embodiment of an EEPROM of the RWW specification having a single redundant column cell array according to the present invention.
Figure 4A:
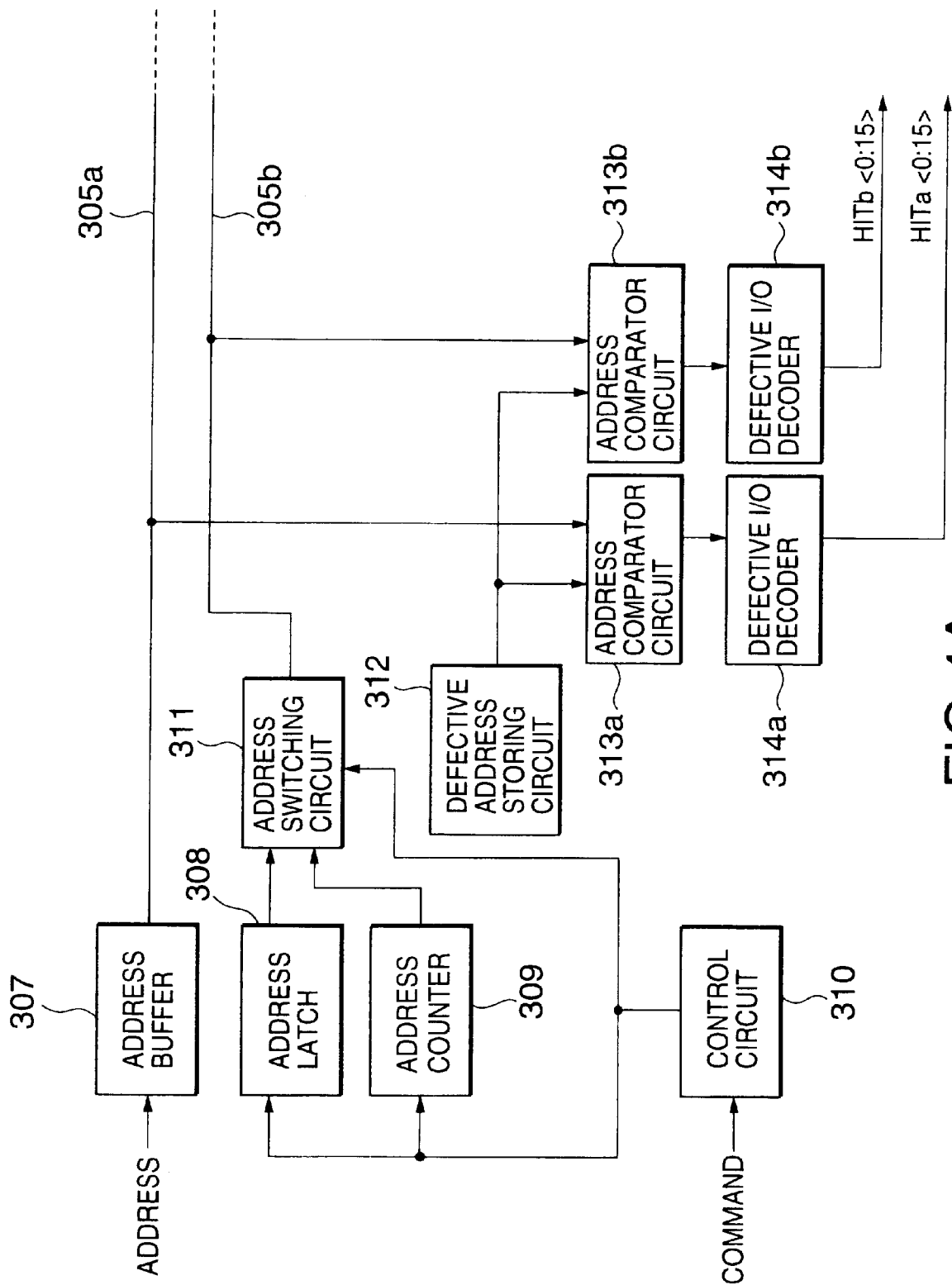
FIG. 4A is a block diagram of an address supply part in the EEPROM of FIG. 3.

FIGS. 3 and 4A show a preferred embodiment of an EEPROM of the RWW (Read While Write) specification having a column redundant circuit accord1ng to the present invention. In the EEPROM of the RWW specification, a memory cell array is divided into at least two banks so that a data write or erase operation can be carried out in one bank while a data read operation is carried out in the other bank. In the embodiment of FIG. 3, a memory cell array 101 comprises two banks BANK0 and BANK1.

In order to make it possible to simultaneously access the two banks BANK0 and BANK1, each of the banks BANK0 and BANK1 is provided with a pre-decoder 301, a row decoder 302 and a column decoder 303. In addition, each of the banks BANK0 and BANK1 is provided with a redundant column cell array 304 comprising a single spare bit line. In order to make it possible to carry out a data write or erase operation in one of the two banks BANK0 and BANK1 while carrying out a data read operation in the other bank, two systems of address bus lines 305a, 305b and data bus lines 306a, 306b are provided commonly for the two banks. That is, the address bus line 305a is provided for carrying out a data read operation, and the address bus line 305b is provided for carrying out a data write or erase operation. The data bus line 306a is provided for carrying out a data read operation, and the data bus line 306b is provided for carrying out a data write or erase operation.

As shown in FIG. 4A, a data write or erase command is inputted to a control circuit. 310. A write address is received by an address latch 308 when a write command is inputted. Although a data erase operation is carried out every erase block of the memory cell array, an erase block address is set in at block selecting register (not shown) corresponding to a selected block when an a erase command is inputted. In a data read operation, an address is supplied to the address bus line 305a via an address buffer 307.

An address switching circuit 311 selects the address, which has been latched by the address latch 308, in a data write operation, and the address, which is sequentially incremented from an address counter 309, in a data erase operation, to supply the selected address to the address bus line 305b.

As shown in FIG. 3, each of the banks BANK0 and BANK1 is provided with a busy, register 315 for indicating the operation mode of the selected bank. With respect to the bank to be written or erased, "H" is set in the busy register 315 by a command from the control circuit 310. With respect to the bank which is not to be written or erased, the busy register 315 holds "L".

Each of the banks BANK0 and BANK1 has a data line switching circuit (DLSW1) 316a for connecting the bank to the reading data bus line 306a, and a data line switching circuit (DLSW2) 316b for connecting the bank to the writing or erasing data bus line 306b. In the shown embodiment, the 16-bit parallel read operation is carried out, so that the number of each of the data line switching circuits 316a and 316b is 16. Similarly, also with respect to the redundant column cell array 304, two systems of data line switching circuits 317a and 317b are provided.

The on-off of these two systems of data line switching circuits is controlled by data of the busy register 315. That is, if the output of the busy register 315 has "H", the data line switching circuits 316b and 317b are turned on, so that the bank is connected to the writing or erasing data bus line 306b. If the output of the busy register 315 has "L", the date line switching circuits 316a and 317a are turned on, so that the bank is connected to the writing or erasing data bus line 306a.

Similarly, also with, respect to the two systems of address bus lines 305a and 305b, each of the banks is provided with two systems of address line switching circuits (AddSW1, AddSW2) 318a and 318b. These address line switching circuits 318a and 318b are also controlled by the busy register 315. That is, if the output of the busy register 315 has "H", the address line switching circuit 318b is turned on, so that the address of the writing or erasing address bus line 305b is supplied to the pre-decoder 301. If the output of the busy register 315 has "L", the address line switching circuit 318a, is turned on, so that the address of the reading address bus line 305a is supplied to the pre-decoder 301.

Sense amplifier circuits 319a for sensing read data are connected to the reading data bus line 306a. Sense amplifier circuits 319b for use in a verify read in a writing or erasing operation are connected to the writing or erasing data bus line 306b. In the shown embodiment, the 16-bit parallel operation is carried out, so that the number of each of the sense amplifier circuits 319a and 319b is 16. In addition in order to read the output of the redundant column cell array 304 each of the data bus line 306a and 306b is provided with a single redundant sense amplifier circuit 320a or 320b.

In order to replace one of the outputs of the sense amplifier circuits 319a with the output of the redundant sense amplifier circuit 320a when a defective column address is selected in a data read operation, a data switching circuit 321a is provided. This data switching circuit 321a is controlled by a bit signal HITa<0:15> generated by the detection of a defective address. Similarly, in order to replace one of the outputs of the sense amplifier circuits 319b with the output of the redundant sense amplifier circuit 320b when a defective column address is selected in a verify read operation, a data switching circuit 321b is provided. This data switching circuit 321b is controlled by a bit signal HITb<0:15> generated by the detection of a defective address.

Then in a usual data read operation, read data are outputted to the outside via a data buffer 323. In addition, read data in the verify read operation are fed to a determining circuit 322, in which a verify determination is carried out.

As shown in FIG. 4A, in order to output bit signals HITa and HITb for the substitution for a defective column in a write or erase verify read operation, address comparator circuits 313a, 313b and defective I/O decoders 314a, 314b are provided so as to correspond to the two systems of address bus lines 305a and 305b. The defective column address of each of the banks, and data of an input/output terminal (I/O) corresponding thereto are stored in an address storing circuit 312. Each of the address comparator circuits 313a and 313b detects the incidence of the address of the address bus lines 305a and 305b with the address, which has been held by the storing circuit 312, in a data read operation and a verify read operation. After the coincidence is detected, hit signals HITa<0:15> and HITb<0:15> are outputted in accordance With a defective I/O by means of the defective I/O decoders 314a and 314b similar to the preceding preferred embodiment.

The operation of the substitution for a defective column in this preferred embodiment will be described in detail below.

In a data read operation, an address acquired from the address buffer 307 is compared with the address of the defective address, storing circuit 312 in the address comparator circuit 313a. If no coincidence is detected, all of hit signals HITa<0:15> have "0". Therefore, all of the data switching circuits 321a select the output of the sense amplifier circuit 319a, so that the output of the sense amplifier circuit 319a, is inputted directly to the data buffer 323.

On the other hand, if, the coincident detection is carried out in the address comparator circuit 313a and if I/O=15 is defective, the hit signal HITa<0> through the hit signal HITa<14> of the hit signals HITa<0:15> have "0", and the hit signal HITa<15> thereof has "1". Thus, in the data switching ng circuit 321a, the output of the sense amplifier circuit 319a of I/O=15 is replaced with the output of the redundant sense amplifier circuit 320a to be outputted to the data buffer 323. The outputs of the sense amplifier circuits 319a other than I/O=15 are inputted directly to the data buffer 323.

In a data write or erase operation, an address from the address latch 308 or the address counter 309 is compared with the address of the defective address storing circuit 312, in the address comparator circuit 313b. If no coincidence is detected, all of the hit signals HITb<0:15> have "0". Therefore, all of the data switching circuits 321b select the output of the sense amplifier circuit 319b, so that the output of the sense amplifier circuit 319b is inputted directly to the determining circuit 322.

On the other hand, if the coincident is detected in the address comparator circuit 313b and, if I/O=15 is defective, the hit signal HITb<0> through the hit signal HITb<14> of the hit signals HITb<0:15> have "0", and the hit signal HITb<15> thereof has "1". Thus, in the data switching circuit 321b, the output of the sense amplifier circuit 319b of I/O=15 is replaced with the output of the redundant sense amplifier circuit 320b to be outputted to the determining circuit 322. The outputs of the sense amplifier circuits 319b other than I/O=15 are inputted directly to the determining circuit 322.

As described above, since the EEPROM in this preferred embodiment has the RWW specification, the two systems of address bus lines and data bus lines are provided commonly for the plurality of banks, and the connections of these two systems of address bus lines and data bus lines are switched by a busy signal, so that a data write or erase operation can be carried out in one bank while a data read operation can be carried out in the other bank. Similar to the first preferred embodiment the output of the redundant column cell array is outputted to the redundant sense amplifier circuit simultaneously with the output of the original memory cell array. Then, two systems of address comparator circuits for detecting the coincidence of the defective address are prepared so as to correspond to the operation modes of two system, and the output of the sense amplifier circuit is switched in each of the operation modes to realize the substitution for a defective column.

Furthermore, in this second preferred embodiment, one redundant column cell array 304 has been provided for simple explanation. However, similar to the first preferred embodiment, a plurality of redundant column cell arrays may be prepared to carry out the substitution for a plurality of columns by the same system as that in the first preferred embodiment.

Figure 4B:
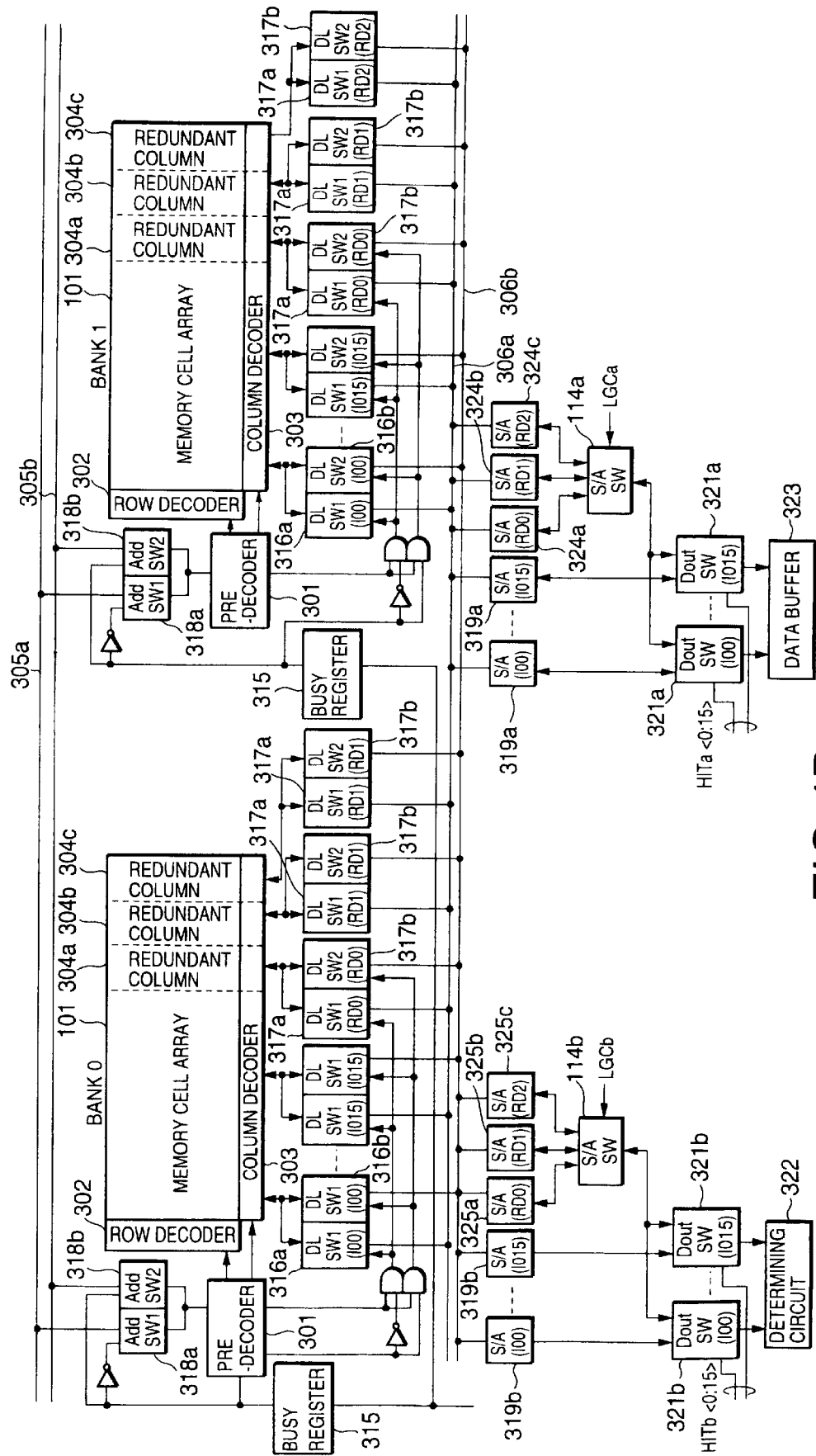
FIG. 4B is a block diagram of a second preferred embodiment of an EEPROM of the RWW specification having a plurality of redundant column cell array s according to the present invention.
Figure 4C:
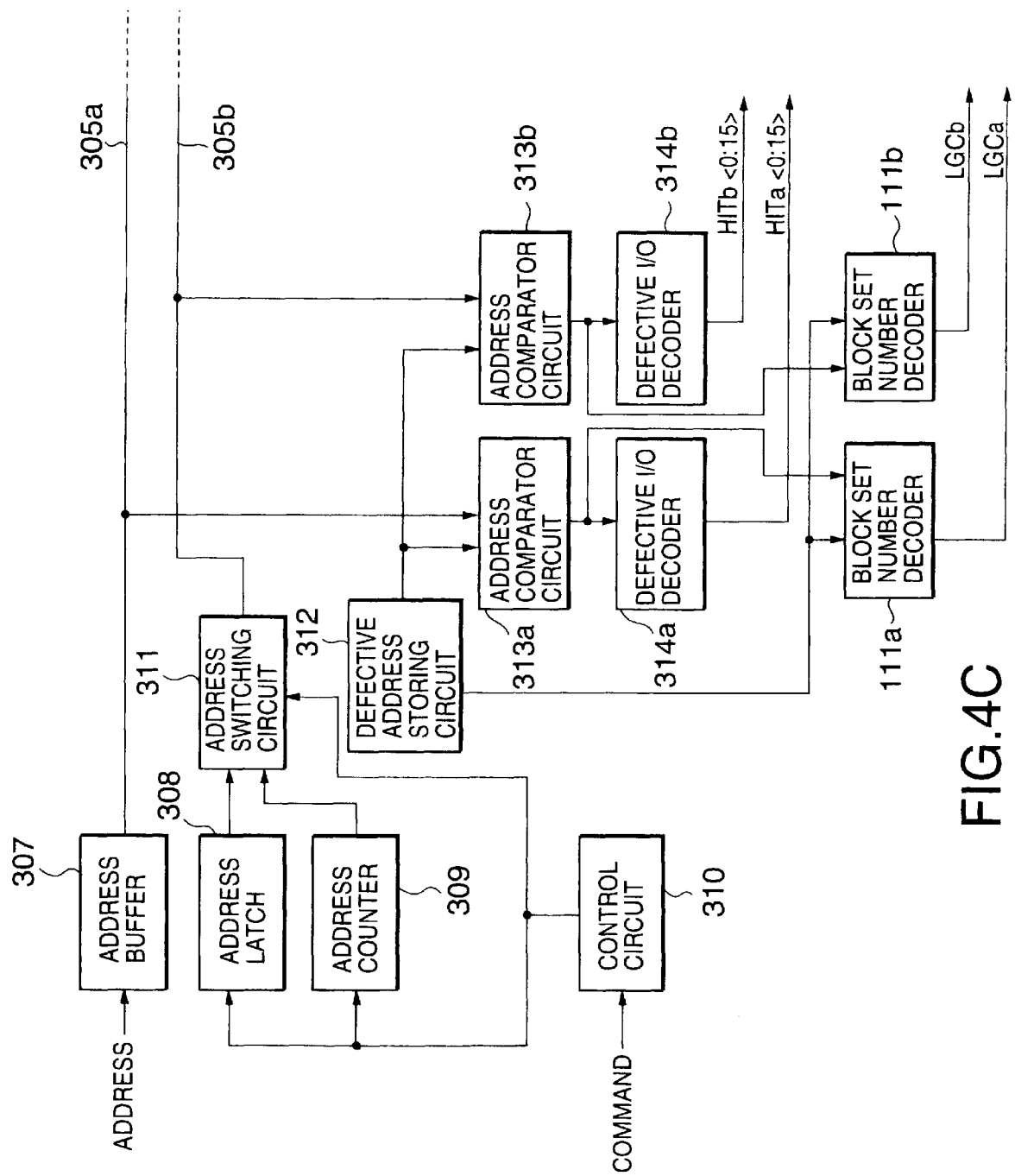
FIG. 4C is a block diagram of an address supply part in the EEPROM of FIG. 4B.

FIGS. 4B and 4C show the construction of an EEPROM then one memory cell array 101 is provided with three redundant column cell arrays 304a through 304c in the second preferred embodiment, which correspond to FIGS. 3 and 4A, respectively.

As shown in FIG. 4B, three sets of data line switching circuits 317a and 317b are provided so as to correspond to the three redundant column cell arrays 304a through 304c. Each of the data line switch circuits 317a is connected to the data reading data bus line 306a, and each of the data line switching circuits 317b is connected to the data writing or erasing data bus line 306b.

The three redundant sense amplifier circuits 324a through 324c are connected to the data reading the bus line 306a. These three redundant sense amplifier circuits 324a through 324c detect and amplify the read data of the three redundant column cell arrays 304a through 304c, respectively. These three redundant sense amplifier circuits 324a through 324c are connected to the sense amplifier switching circuit 114a via three data bus lines. Moreover, the sense amplifier switching circuit 114a is connected to each of the data switching circuits 321a in the wiring form that one data bus line finally branches. This sense amplifier switching circuit 114a is a circuit for connecting one of data bus lines from the redundant some amplifier circuits 324a through 324c to the data switching circuit 321a on the basis of a logic signal LGCa outputted from the block set number decoder 111a (see FIG. 4C).

That is, in a data read operation when a column of the memory cell array 101 is replaced KUM any one of the redundant cell arrays 304a through 304c, one redundant cell array 304 is selected by the sense amplifier switching circuit 114a. Then, in the data switching circuit: 321a corresponding to a column to be replaced, data from the sense amplifier switching circuit 114a are outputted to the data buffer 323 in place of data from the sense amplifier circuit 319a. Thus, the substitution for a defective column in a data read operation is carried out.

On the other hand, three redundant sense amplifier circuits 325a through 320 are connected to the writing or erasing data bus line 306b. These three redundant sense amplifier circuits 325a through 325c detect and amplify the verify read data of the three redundant column cell arrays 304a through 304c, respectively. These three redundant sense amplifier circuits 325a through 325c are connected to the sense amplifier switching circuit 114b via three data bus lines. Moreover, the sense amplifier switching circuit 114b is connected to each of the data switching circuits 321b in the wiring form that one data bus finally branches. This sense amplifier switching circuit 114b is a circuit for connecting one of the data bus lines from the redundant sense amplifier circuits 324a through 324c to the data switching circuit 321b on the basis of a logic signal LGCb outputted from the block set number decoder 111b (see FIG. 4C).

That is, in a verify data, read operation, when a column of the memory cell array 101 is replaced with any one of the redundant cell arrays 304a through 304c, one redundant cell array 304 is selected by means of the sense amplifier switching circuit 114b. Then, in the data switching circuit 321b corresponding to a column to be replaced, data from the sense amplifier switching circuit 114b are outputted to the determining circuit 322 in place of data from the sense amplifier circuit 319b. Thus, the substitution for defective column during a verify data read in a write or erase operation is carried out.

Third Preferred Embodiment

Figure 5:
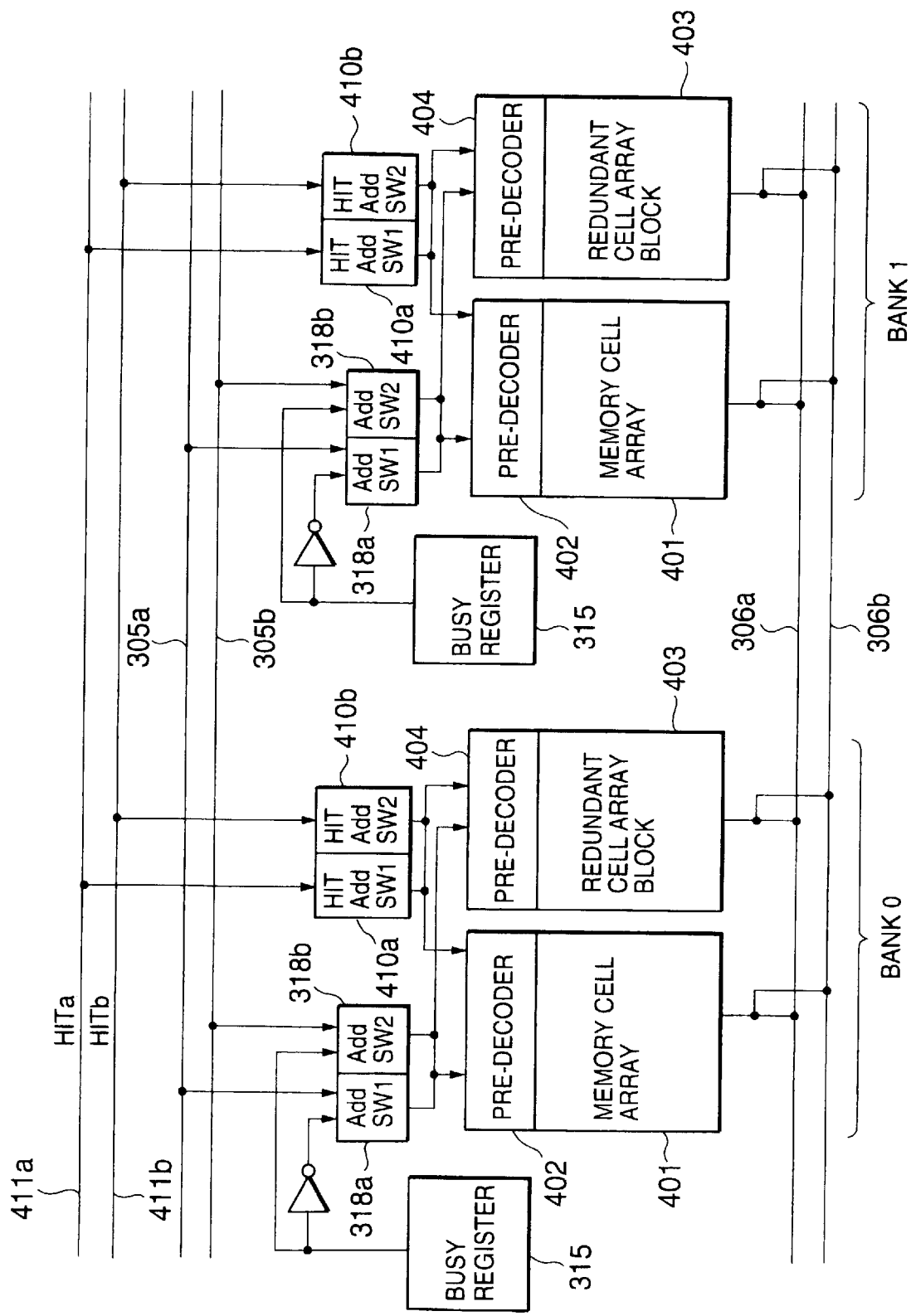
FIG. 5 is a block diagram of another preferred embodiment of an EEPROM of the RWW specification having a redundant column cell array according to the present invention.
Figure 6:
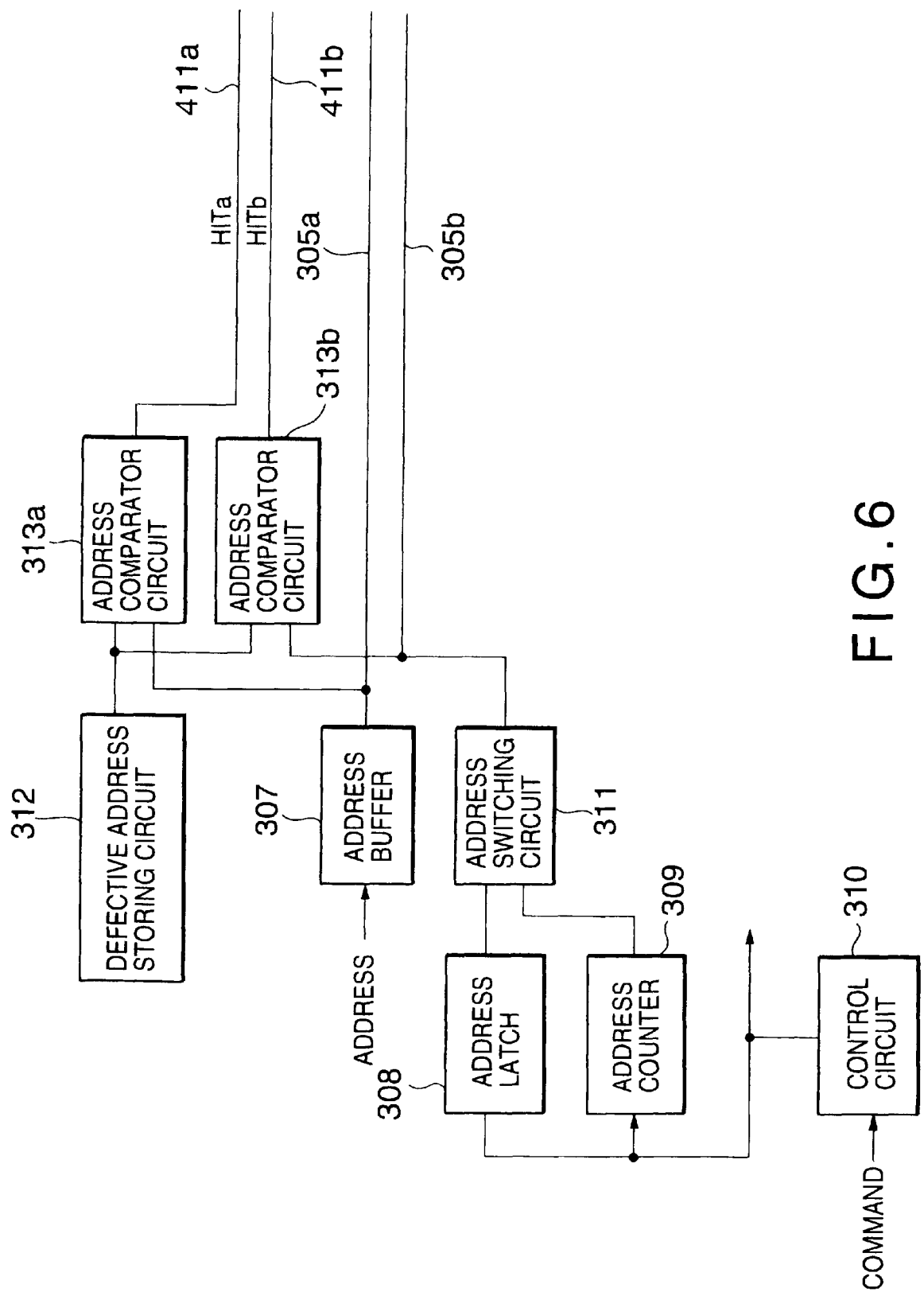
FIG. 6 is a block diagram of an address supply part in this preferred embodiment.

FIGS. 5 and 6 show a preferred embodiment of an EEPROM of the RWW specification of a block redundant circuit system wherein a block which is the minimum unit for data, erase in the memory cell many and which is a set of a plurality of memory cells corresponds to a unit for substitution for defect relief. A memory cell array 401 basically has the same construction as those in the first and second preferred embodiments, except that it is divided into at least two banks BANK0 and BANK1 similar to the second preferred embodiment. In order to substitute for a defective block in each of the banks of the memory cell array 401, a redundant cell array block (which will be hereinafter simply referred. to as a redundant block) 403 is provided. The redundant block 403 comprises one spare block or a plurality of spare blocks.

In the figure, the memory cell array 401 and the redundant block 403 include a row decoder, a column decoder and a sense amplifier circuit. As memory cell array 401 and the redundant block 403 are provided with pre-decoders 402 and 404 for decoding a row address and column address supplied thereto, respectively.

Similar to the preceding second preferred embodiment, two systems of address bus lines 305a and 305b are provided. In addition, each of the banks BANK0 and BANK1 is provided with a busy register 315 and with address line switching circuits 318a and 318b which are on-off controlled by the busy register 315. That is, in a write or erase mode, the address of the address bus line 305b is simultaneously supplied to the pre-decoders 402 and 404 by the address line switch circuit 318b. In a read mode, the address of the address bus line 305a is simultaneously supplied to the pre-decoders 402 and 404 by the address line switching circuit 318a.

The construction of an address supply part shown in FIG. 6 is basically the same as that in the preceding preferred embodiment shown in FIG. 4A. Then, if the output signal lines 411a and 411b of two systems of address comparator circuits 313a and 313b are provided commonly for the two banks BANK0 and BANK1 and if the coincidence with the defective address is detected, hit signals HITa="H" and HITb="H" are outputted thereto.

Each of the banks BANK0 and BANK1 is provided with two systems of high address switching circuits 410a and 410b. When the hit signals HITa=HITb="L", the high address switching circuits 410a and 410b cause the pre-decoder 402 on the side of the memory cell array 401 to be active, and the pre-decoder 404 on the side of the redundant block to be inactive. Then, when the bit signal HITa="H", the high address switching circuit 410a causes the pre-decoder 402 to be inactive and the pre-decoder 404 to be active. The hit address switching circuit 410b also controls the activity and inactivity on the sides of the memory cell array 401 and redundant block 403.

Also in this preferred embodiment similar to the preceding second preferred embodiment the reading data bus line 306a and the writing or erasing data bus line 306b are provided commonly far each of the banks BANK0 and BANK1. Although addresses have been simultaneously supplied to the memory cell array 401 and the redundant block 403, when an input address is not coincident with the defective address, the side of the memory cell array 401 is active, and when the input address hits the defective address, the side of the redundant block 403 is active, so that data are read out therefrom. These read data are switched to the reading data bus line 306a or the verify reading data bus line 306b in accordance with the operation mode to be outputted.

As described above, according to this preferred embodiment, the control of the substitution for a defective address every block in a bank, in which a data read operation is being carried out, is independent of that in a bank, in which a data write or erase operation is being carried out.

However, in this preferred embodiment, the replacement of a block with a redundant block 403 is carried out only within a bank, to which the redundant block belongs.

Fourth Preferred Embodiment

Figure 7:
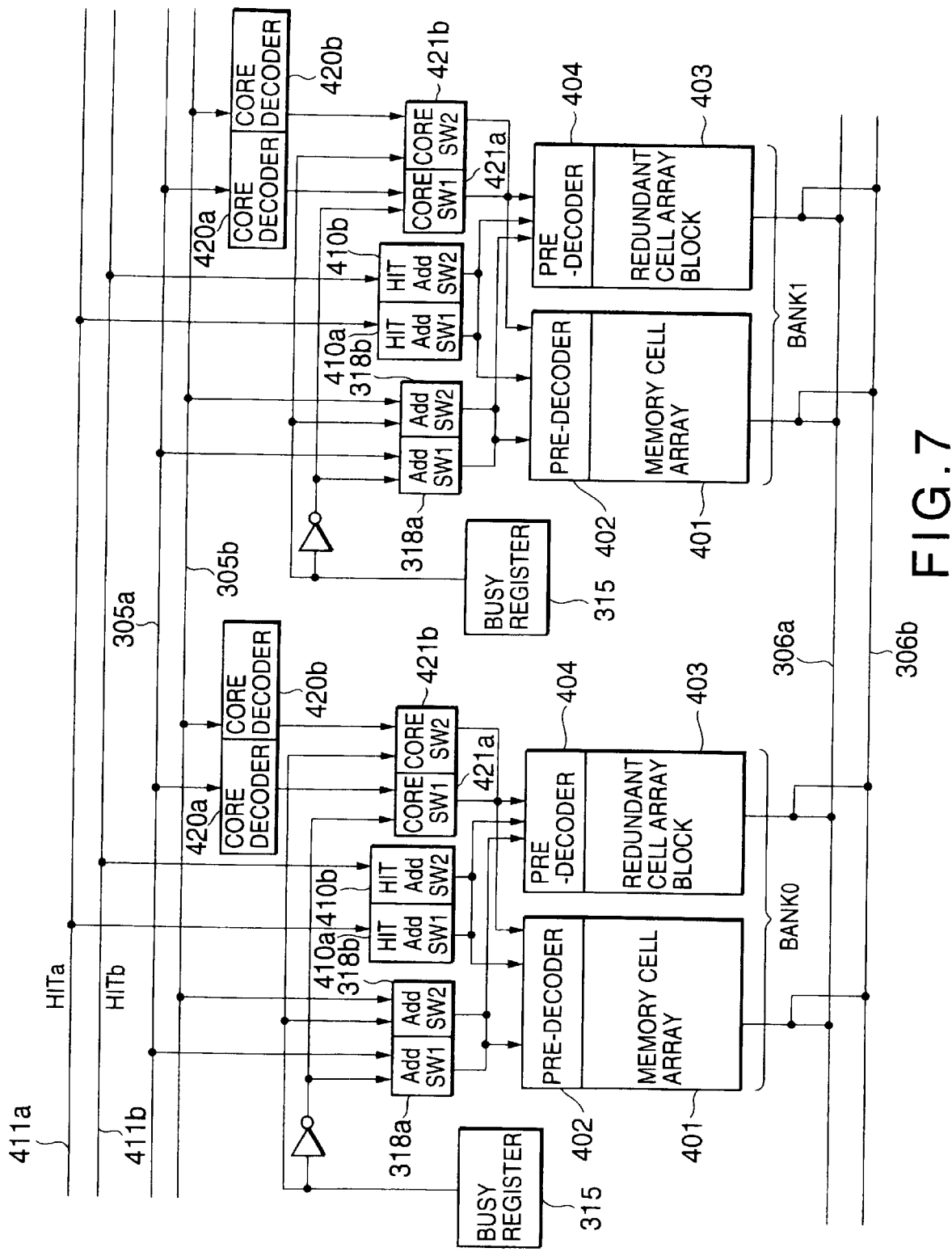
FIG. 7 is a block diagram. of another preferred embodiment of an EEPROM of the RWW specification having a redundant column cell array according to the present invention.

FIG. 7 shows a preferred embodiment as the a modification of the third preferred embodiment. The difference between this preferred embodiment, and the preferred embodiment shown in FIG. 5 is that each of the banks BANK0 and BANK1 is provided with core decoders 420a and 420b for selecting a core in the bank, so as to correspond to two systems of address bus lines 305a and 305b. The "core" is herein a set of a plurality of blocks, each of which is the minimum unit for data erase. For example, eight blocks constitute one core. The bank comprises one core or a plurality of cores.

The core decoders 420a and 420b are supplied to the pre-decoder 402 on the side of the memory cell array 401 and to the pre-decoder 404 on the side of the redundant block 403 via core switching circuits 421a and 421b which are selectively on-off controlled by the busy register 315. That is, in the bank wherein the output of the busy register 315 has "H", the core address of the address bus line 305b is decoded by the cane decoder 420b to be supplied to the pre-decoder 402 and 404 via the core switching circuit 421b. The fact that the pre-decoders 402 and 404 are selectively active and inactive by the bit signal HITb is the same as that in the preceding third preferred embodiment. In the bank wherein the output of the busy register 315 has "L", the CORE address of the address bus line 305a is decoded by the CORE decoder 420a to be supplied to the pre-decoders 402 and 404 via the core switching circuit 421a. Also in this case, the pre-decoders 402 and 404 are selectively active and inactive in accordance with the bit signal HITa which is the result of the coincidence detection with the defective address.

Also accord1ng to this fourth preferred embodiment similar to the third preferred embodiment, the control of the substitution for a defective address every block in a bank, in which a data read operation is being carried out, is independent of that in a bank, in which a data write or erase operation, is being carried out. In addition, in this preferred embodiment, the core decoders 420a and 420b for decoding core addresses are provided upstream of the pre-decoder 404, so that the number of switches of the address line switching circuits 318a and 318b can be less than that in the preceding third preferred embodiment.

Figure 10:
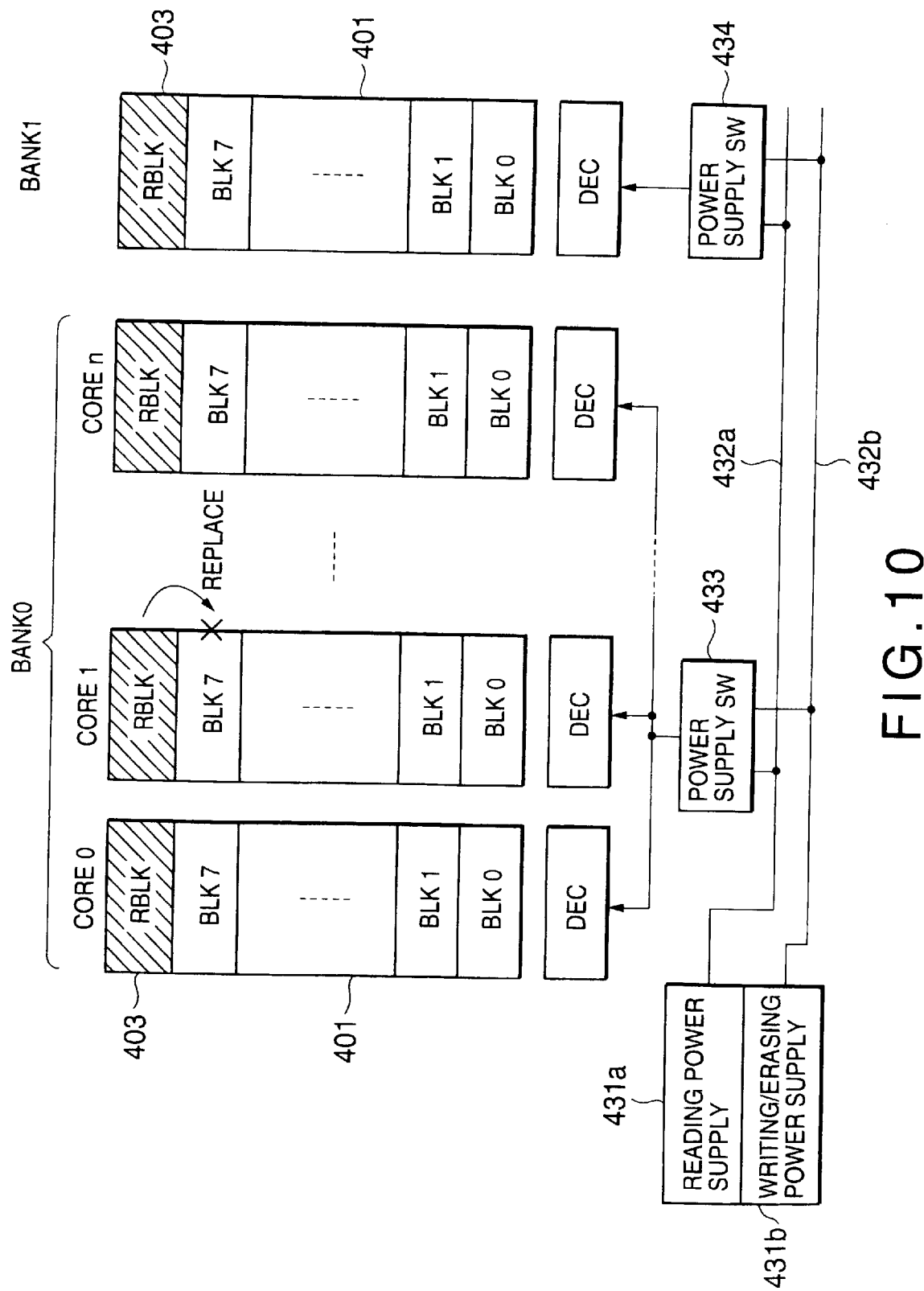
FIG. 10 is a diagram showing the replacement of a block with a redundant cell array block in the preferred embodiments of FIGS. 5 and 7.

FIG. 10 is a conceptual diagram showing the state of the defective block substitution in the third or fourth preferred embodiment of an RWW type EEPROM. While the description of the relationship between power supplies has been omitted above, separate power supply lines 432a and 432b, which are connected to a reading power supply 431a and a writing or erasing power supply 431b, respectively, are provided commonly for the tanks BANK0 and BANK1 as shown in this figure in order to meet the RWW specification. In accordance with the operation mode of each of the banks, these power supply lines 432a and 432b, are selected by power supply line switching circuits 433 and 434 to be connected to each of the banks BANK0 and BANK1.

FIG. 10 also shows the case where one bank BANK0 has a large capacity and comprises a plurality of cores 0 through n, and the other bank BANK1 comprises a single core. Eight blocks BLK0 through BLK7 are prepared for each block as normal blocks, and each core is provided with a spare block RBLK having a common core address. This spare block RBLK constitutes the above described redundant block 403.

In the third and fourth preferred embodiments, for example, as shown in FIG. 10, if the block BLK7 of core 1 in the bank BANK0, is defective as marked X, the defective block is replaced with the spare block RBLK attached to core 1. That is, in the third and fourth preferred embodiments, the block substitution range is not only limited to the same bank, but it is also limited to the same core. In other words, if a defect exists in a certain core, it is only possible to replace with a spare block having a core address common to that of the core.

Fifth Preferred Embodiment

Figure 8:
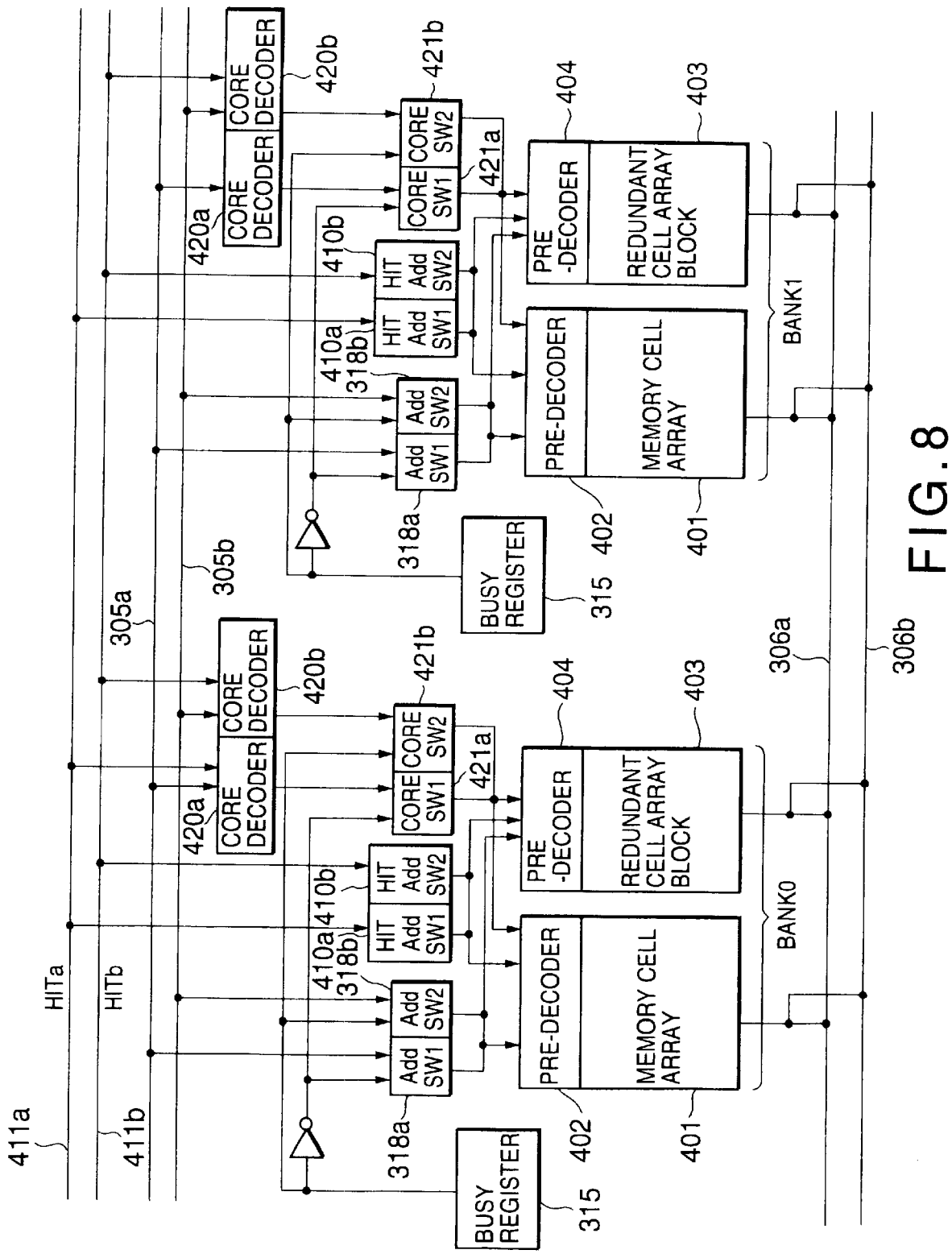
FIG. 8 is a block diagram of another preferred embodiment of an EEPROM of the RWW specification having a redundant column cell array according to the present invention.

FIG. 8 is a preferred embodiment wherein the preferred embodiment shown in FIG. 7 is modified to increase the degree of freedom for the block substitution. In this preferred embodiment unlike the preferred embodiment shown in FIG. 7, hit signals HITa and HITb enter core decoders 420a and 420b. However, in this case, the hit signals HITa and HITb include a core address of a core including a spare block to be substituted, as well as an address coincidence detection signal.

Specifically, the defective address storing circuit 312 shown in FIG. 6 has stored therein the core address of the spare block to be substituted for the block of the defective block address, as well as the defective block address. The address comparator circuits 313a and 313b output the hit signals HITa and HITb including a core address, to which the spare block to be substituted belongs, while outputting the coincidence detection signal of the defective address, to feed dose signals to the core decoders 420a and 420b. Thus, the core decoder 420a and 420b decode the core address, which is assigned when the defective address is detected, to select the spare block.

Figure 11:
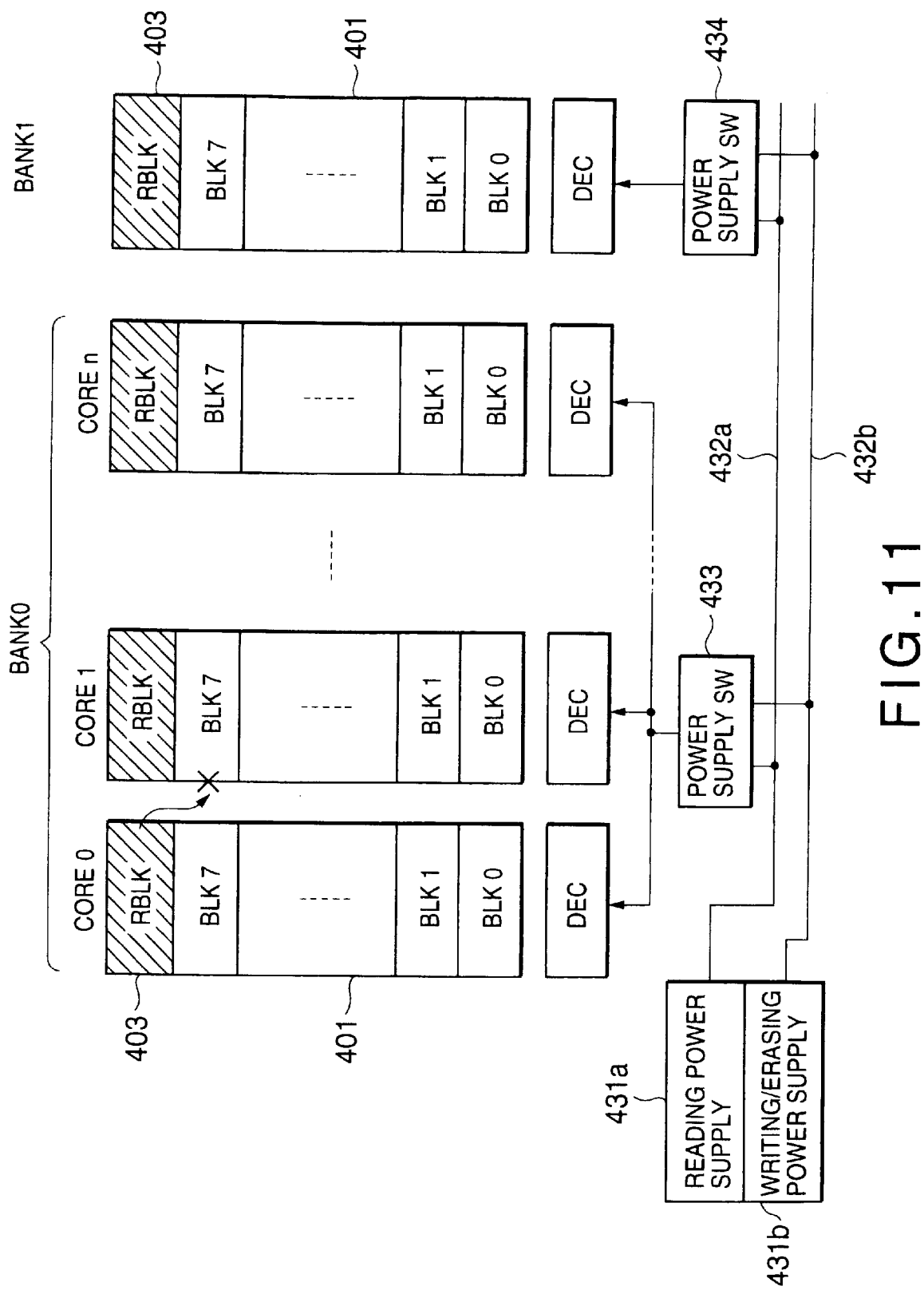
FIG. 11 is a diagram showing the replacement of a block with a redundant cell array block in the preferred embodiment of FIG. 8.

FIG. 11 shows the state of the block substitution in this preferred embodiment which corresponds to FIG. 10. For example, as shown in this figure if the block BLK7 of core 1 is defective, the defective block BLK7 can not only be replaced with the spare block RBLK belonging to core 1, but it can also be replaced with the spare block RBLK of core 0.

Therefore, according to this preferred embodiment, the degree of freedom for the defective block substitution can be further increased to realize a high relief efficiency.

Sixth Preferred Embodiment

Figure 9:
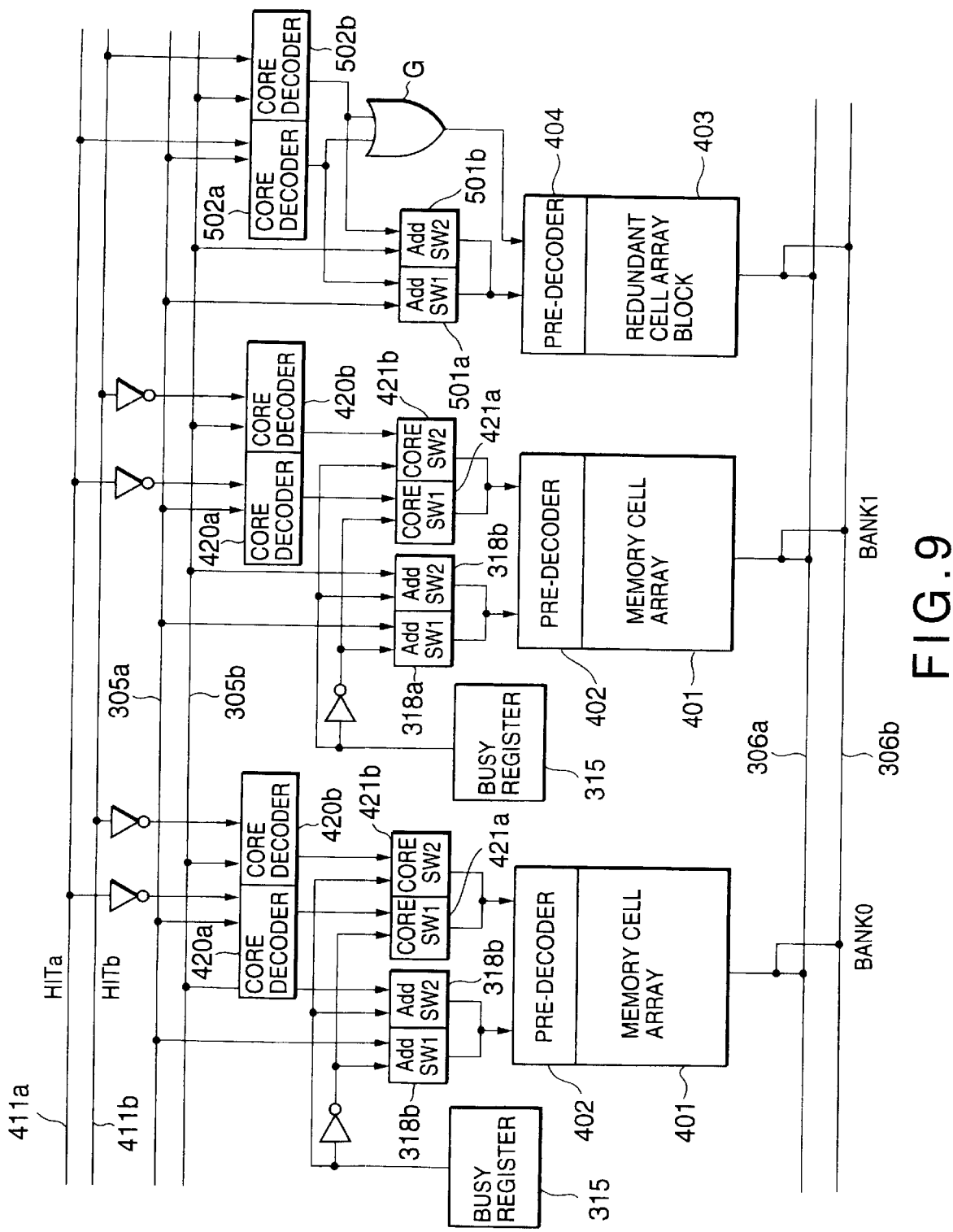
FIG. 9 is a block diagram of another preferred embodiment of an EEPROM of the RWW specification having a redundant column cell array according to the present invention.

FIG. 9 shows a preferred embodiment wherein the restrictions on the block substitution, which should be carried out within the limits of the bank, are removed to further enhance the degree of freedom for the block substitution. In this preferred embodiment unlike this preceding third through fifth preferred embodiments, a redundant block 403 is provided independently of the memory cell arrays 401 of the banks BANK0 and BANK1. Specifically, the fact that the redundant block 403 is independent of the banks BANK0 and BANK1 means that an address is supplied only when a defective address is detected independently of the decoding circuits of the memory cell arrays 401 of the banks BANK0 and BANK1.

That is, in addition to the address line switching circuits 318a and 318b of each of the banks BANK0 and BANK1, the redundant block 403 is also provided with address line switching circuits 501a and 501b for switching two systems of address lines 305a and 305b. In addition, each of the banks BANK0 and BANK1 is provided with core decoders 420a and 420b which correspond to the two systems of address bus lines 305a and 305b, respectively, and the redundant block 403 is also provided with core decoders 502a and 502b which correspond to the address bus lines 305a and 305b, respectively.

Hit signals HITa and HITb obtained in output signal lines 411a and 411b of two system of address comparator circuits 313a and 313b are inverted to enter, as activated signals, the core decoders 420a and 420b of each of the banks BANK0 and BANK1. In addition, the hit signals HITa and HITb obtained in the output signal lines 411a and 411b directly enter, as activated signals, the core decoders 502a and 502b an the side of the redundant block 403.

Then, one address line switching circuit 501a is turned on by the output of the core decoder 502a, and the other address line switching circuit 501b is turned on by the output of the core decoder 502b. In addition, the defective address storing circuit 312 stores therein an address of a spare block to be substituted, as well as a defective block, and outputs the address of the spare block while outputting a coincidence detection signal. The disjunction of the outputs of the core decoders 502a and 502b is derived by an OR gate G to be used as a core selecting signal to control the activity and inactivity of the pre-decoder 404 on the side of the redundant block 403.

In this preferred embodiment, if no defective block address is detected, the core decoders 420a and 420b of each of the banks BANK0 and BANK1 are active, and an access corresponding to the operation mode with respect to each of the banks BANK0 and BANK1 is obtained in accordance with the output of the busy register 315. If a defective block address is detected, the core decoders 420a and 420b of each of the banks BANK0 and BANK1 are inactive, but the core decoders 502a and 502b on the side of the redundant block 403 are active. Then, in accordance with the operation mode, an access to the redundant block 403 is obtained by the addresses of the address signal lines 305a and 305b, so that a specific spare block is selected.

Therefore, accord1ng to this preferred embodiment, the redundant block 403 can be substituted for defective blocks of either of the banks BANK0 and BANK1. The state of the block substitution in this preferred embodiment is conceptually shown in FIG. 12. In the shown example, one spare block RBLK1 of the redundant block 403 is substituted for the defective block BLK7 in core n of the bank BANK0, and other spare blocks RBLK2 and RBLK3 are substituted for the blocks BLK6 and BLK7 in the bank BANK1 respectively.

As described above, according to this preferred embodiment, the block substitution can be carried out without the restrictions on the bank to enhance the degree of freedom for substitution and the relief efficiency.

Figure 12:
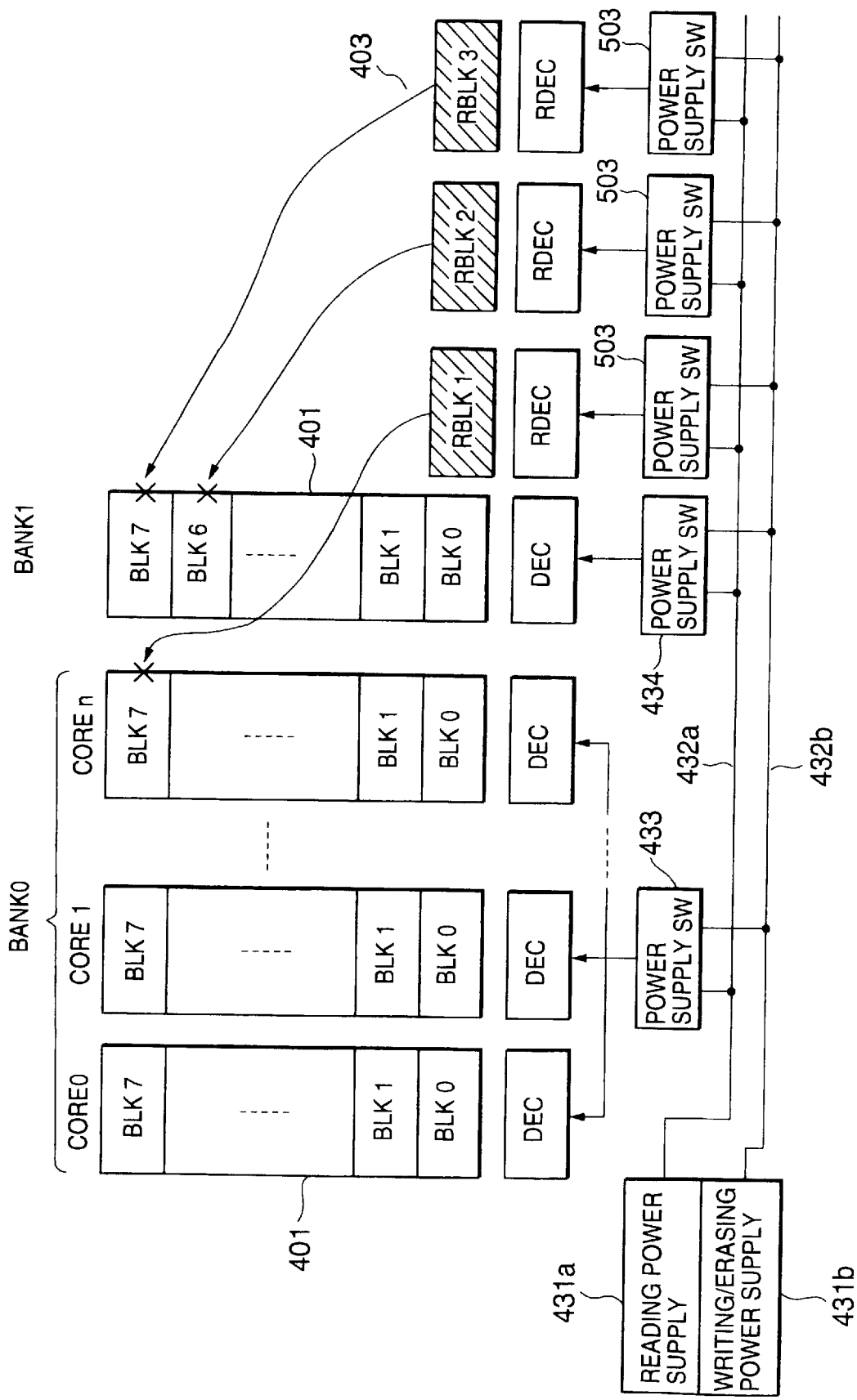
FIG. 12 is a diagram showing the replacement of a block with a redundant cell array block in the preferred embodiment of FIG. 9.

However, when the block substitution is carried out without the restrictions on the bank as described above, it is required to carry out the switching control of the relationship between power supplies, in accordance with the operation move every spare block on the side of the redundant block 403. Therefore, as shown in FIG. 12, each of the spare blocks is provided with a power supply switching circuit 503. Specifically, if the bank BANK0 is in a data read mode and if a block substitution is carried out in the bank, it is required to connect the reading power supply line 432a to the spare block.

Seventh Preferred Embodiment

FIGS. 10 and 11 show the case where the capacities of the banks BANK0) and BANK1 are different, and spare blocks are arranged in accordance with the capacities. In this case, the number of spare blocks on the side of the bank BANK1 having a smaller capacity is naturally smaller. Therefore, if the substitution range is limited to the range of the bank, it is not possible to replace a large number of blocks in the bank having the smaller capacity.

Figure 13:
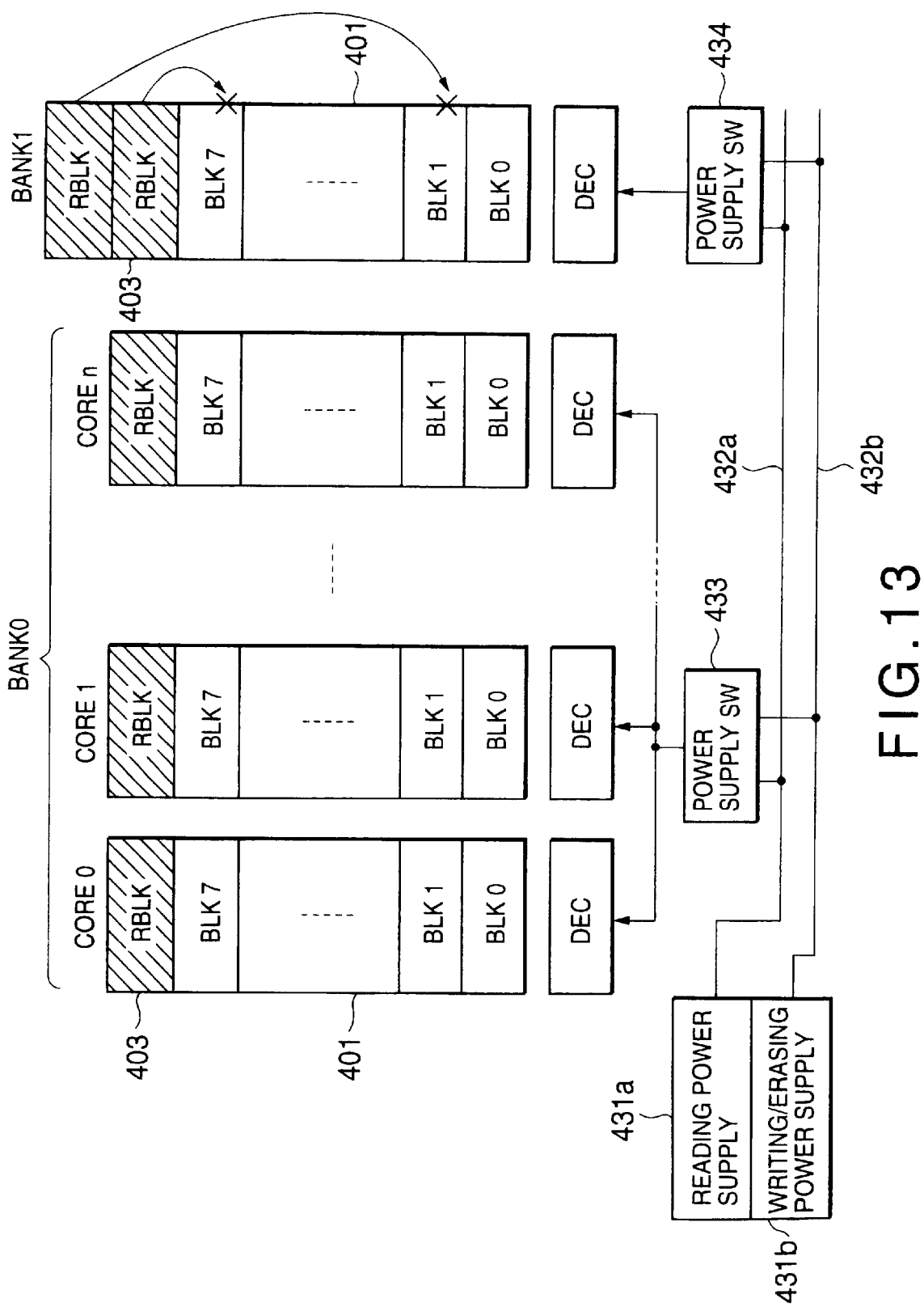
FIG. 13 is a diagram showing the replacement of a block with a redundant cell array block in a modified preferred embodiment of the preferred embodiments of FIGS. 5 and 7.

FIG. 13 shows a preferred embodiment, taking account of this point so as to correspond to FIG. 11. In the bank BANK0, one spare block RBLK is arranged with respect to one core, whereas in the bank BANK1 comprising one core, two spare blocks are arranged. Thus, the substitution efficiency in the bank BANK1 having the smaller capacity can be increased. Specifically, if the capacities of the two banks are different, the capacity ratio of the spare block in the bank having the smaller capacity to the memory cell array is set to be greater than the capacity ratio of the spare block in the bank having the larger capacity to the memory cell array. Thus, it is possible to efficiently car, out the defective block substitution even in the bank having the small capacity.

Eighth preferred Embodiment

A preferred embodiment wherein a memory cell array is equipped with a redundant row, cell array to carry out a defective row substitution will be described below.

In this preferred embodiment main word lines continuously extending aver a plurality of blocks in the row directions of a memory cell array are provided, and each of the blocks is provided with separate word lines. One of the main word lines is selected by a row main decoder, and word lines of a plurality of blocks along the selected main word line are selected by a row sub-decoder. Such a decode system is called a two-stage decode system which is described in, e. g. , Japanese Patent Application No. H11-73226 which has not been publicly known and which has been individually known by the inventor.

In such a cell array construction, the substitution for a defective row is usually carried out every main word line. On the other hand, in this preferred embodiment, a defective row substitution can be carried out every block. Simultaneously, in a data erase mode every block, in which a negative voltage is applied to word lines, the word lines of a defective row and the word lines of unselected blocks can be set at 0 V to prevent useless pass current from flowing.

Figure 14:
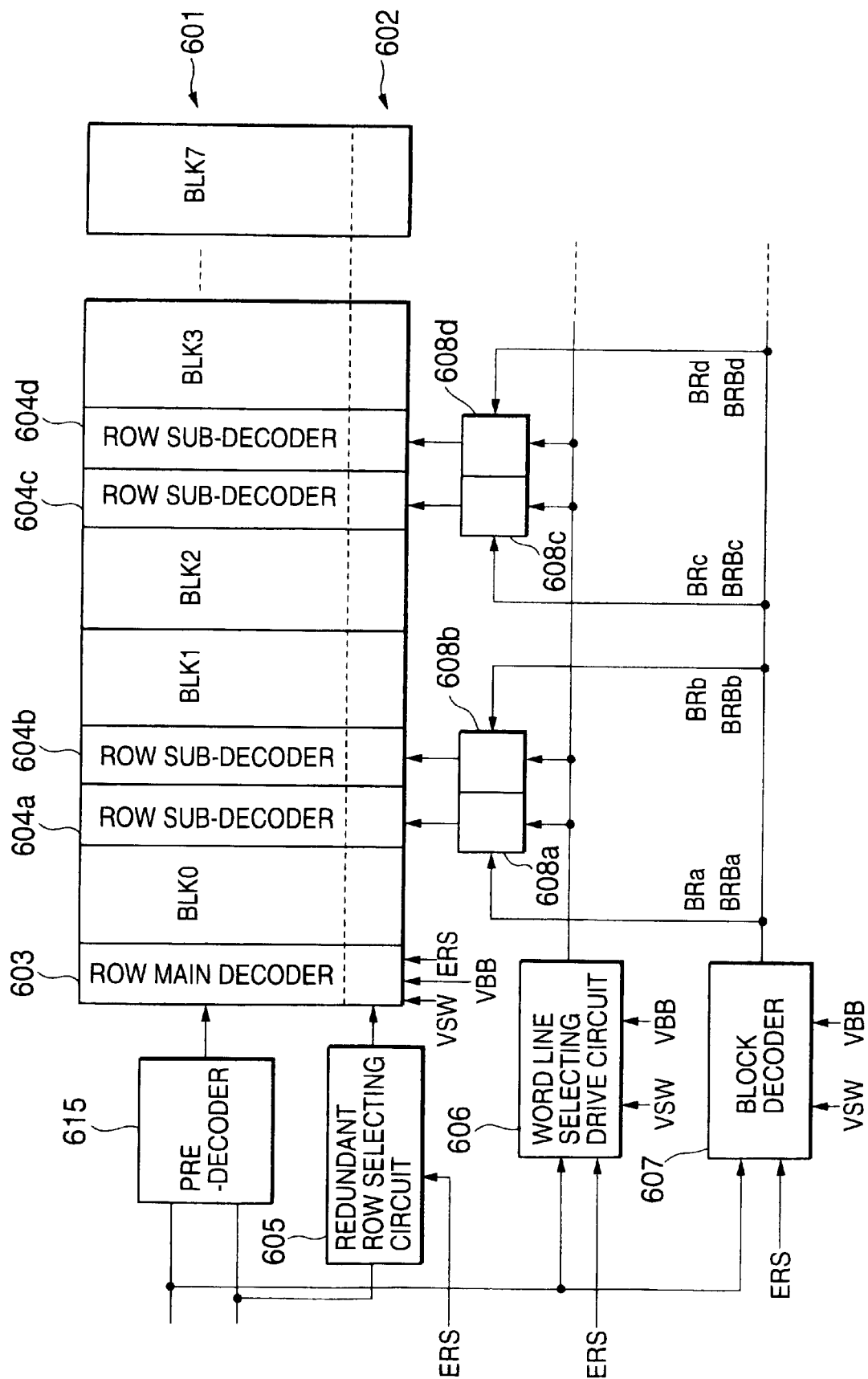
FIG. 14 is a block diagram of a preferred embodiment of an EEPROM having a redundant row cell array according to the present invention.
Figure 16:
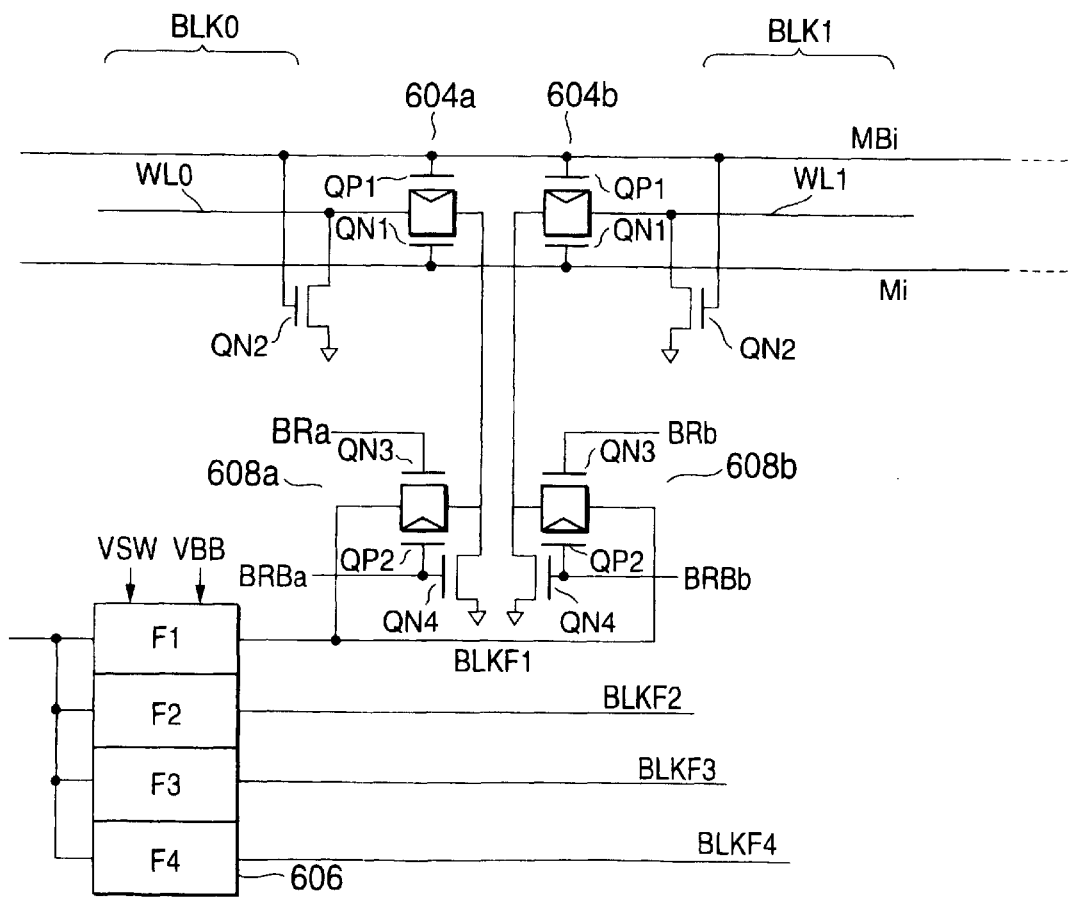
FIG. 16 is a diagram showing the details of a principal part in this preferred embodiment.

FIG. 14 shows the constructions of a memory cell array 601 and a selecting drive circuit part of a row system thereof in this preferred embodiment. As the memory cell array 601, this figure shows one core portion comprising eight blocks BLK0 through BLK7 in row directions. Usually, one core or a plurality of cores, each of which is the same as the core portion, are arranged to constitute an EEPROM. As shown in FIG. 16, in the memory cell array 601, there are arranged main word lines Mi and MBi, which continuously extend over the blocks BLK0 and BLK7 and which are complementary signal lines to each other, and word lines WL0 and WL7 for each block, which are selected by the main word lines Mi and MBi. For this memory cell array 601, a redundant row cell array 602 is arranged. The redundant row cell array 602 has one or more redundant main word lines.

A row main decoder 603 selects one of the main word lines Mi and MBi of the memory cell array 601, and each of row sub-decoders 604 (604a, 604b, . . . ), each of which is provided in a corresponding one of the blocks, selects one of the word lines WL in the corresponding one of the blocks on the basis of the selected main work line Mi or MBi. In this preferred embodiment, two row sub-decoders 604 are provided between adjacent two blocks. Specifically, as shown in FIG. 16, each of the row sub-decoders 604 has a transfer gate, which comprises an NMOS transistor QN1 and PMOS transistor QP1 which are driven by the main word lines Mi and MBi, and an NMOS transistor QN2 which is driven by the main word line MBi for resetting the word line WL at VSS.

Specifically, the row sub-decoder 604 is designed to transfer word line driving voltages BLKF1 through BLKF4, which are generated from the word line selecting drive circuit 606 in accordance with the operation mode, to the word line WL of each block. As shown in FIG. 16, in this preferred embodiment, the word line selecting drive circuit 606 comprises four drivers F1 through F4 common to every adjacent two blocks. In addition, transfer gates 608 (608a, 608b, . . . ) are provided between the row sub-decoder 604 and the word line selecting drive circuit 606. These transfer gates 608 are designed to selectively transfer the output of each of the drivers F1 and F4 of the word line selecting drive circuit 606 to the row sub-decoder 604, Each of the transfer gates 608 comprises an NMOS transistor QN3 and PMOS transistor QP2, which are controlled by complementary outputs BR and BRB (BRa and BRBa, BRb and BRBb, . . . ) of a block decoder 607 for decoding a block address, and an NMOS transistor QN4 for resetting an input signal line to the row sub-decoder 604 at VSS.

Figure 15:
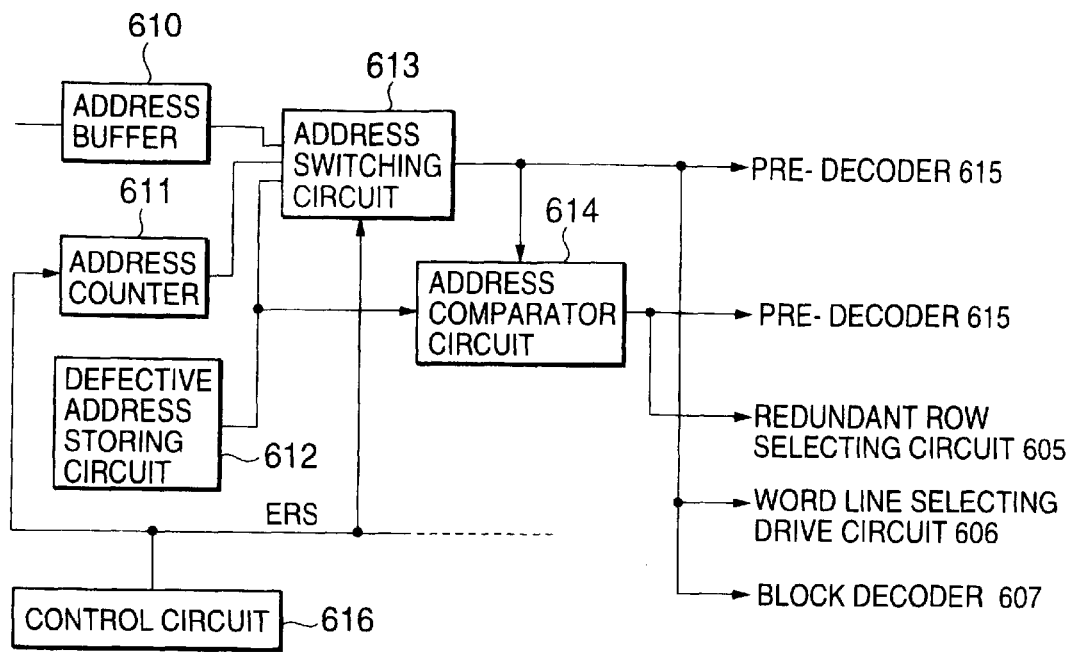
FIG. 15 is a block diagram of an address supply part in this preferred embodiment.

As shown in FIG. 15, the output of an address buffer 610 for acquiring an external address in a data read operation, and the output of an address counter 611 for generating sequentially updated addresses in a data erase verify operation are switched by an address switching circuit 613 in accordance with the operation mode to be fed to a pre-decoder 615, the word line selecting drive circuit 606 and the block decoder 607. The pre-decoder 615 separates a row address and a column address from each other to supply the separated addresses to the main row decoder 603 and column decoder (not shown), respectively. The word line selecting drive circuit 606 receives a signal for simultaneously selecting eight blocks (e.g., a core selecting signal when one core comprises eight blocks) to generate a word line driving voltage.

In FIG. 14, the elements of the column system are omitted. However, there are provided a column decoder for carrying out a bit line selection similar to usual EEPROMs, and a sense amplifier circuit for detecting read data of a bit line selected by the column decoder and for latching write data.

In this preferred embodiment, a defective address storing circuit 612 is designed to store therein a block address including a defective word line, as well as a defective row address. A defective address storing circuit 612 for detecting the coincidence of an internal address, which is obtained by an address switching circuit 613, with a defective address, which is stored in the defective address storing circuit 612, outputs a hit signal HIT by the coincidence detection. Thus, the pre-decoder 615 is deactivated, and the redundant row selecting circuit 605 is activated, so that the defective row is replaced by the redundant row cell array.

In the case of data erase, the address switching circuit 613 is controlled by an erase mode control signal ERS, which is obtained from a control circuit, for acquiring the defective row address of the defective address storing circuit 612 and the block address. Thus, the pre-decoder 615 selects the defective row, and the row main decoder 603 is set so that only the defective row is "unselected" and other rows are "selected". The block decoder 607 selects a block to be erased, and controls the transfer gate 608. Thus, in a block selected as an object to be erased, 0 V is applied to the defective word line, and a negative voltage VBB is applied to all of other word lines, although this will be described in detail later. In addition, in the unselected block, all of word lines are controlled so as to have a voltage of 0 V regardless of the presence of selection of a main word line.

Figure 17:
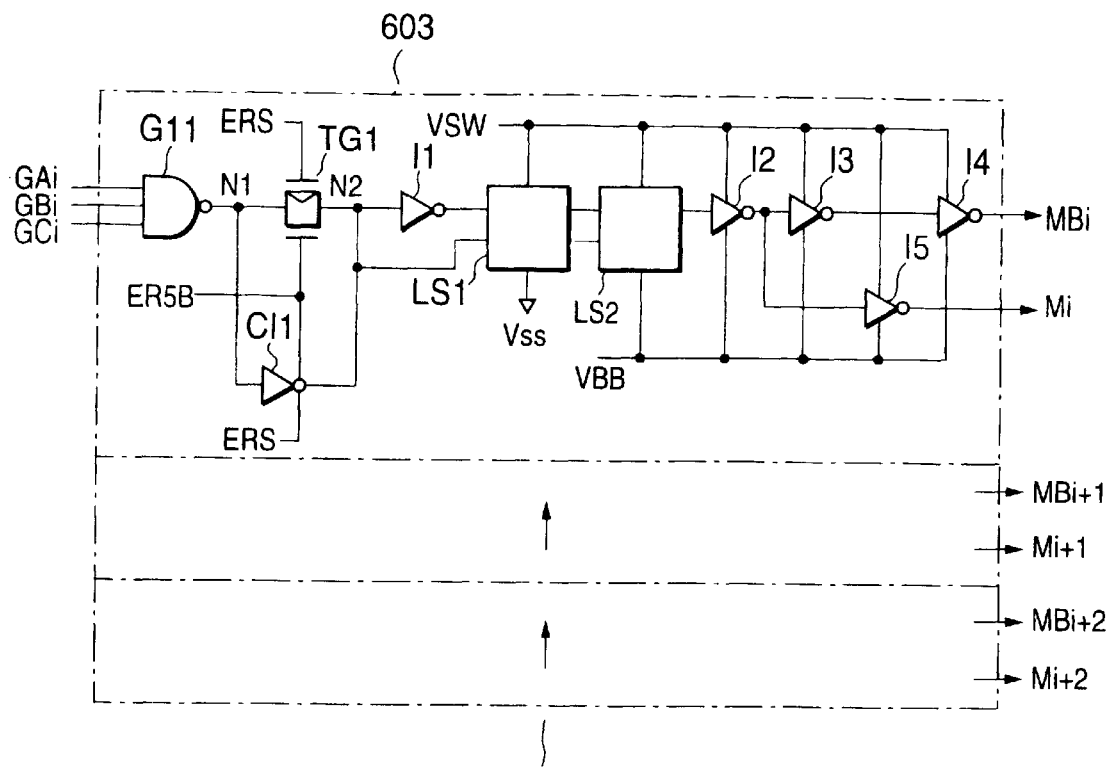
FIG. 17 is a diagram showing the construction of a row main decoder in this preferred embodiment.

The row main decoder 603 is formed as shown in FIG. 17. A NAND gate G11 is a decoding gate for selecting a main word line. The signal of the output node N1 of the NAND gate G11 is transferred directly to a node N2 by a transfer gate TG1 in a mode other than an erase mode (i.e., when erase control signal ERS="L"). In addition in an erase mode (i.e., when ERS="H"), the signal of the node N12 is inverted by a clocked inverter CI1 to be transferred.

The signal of the node N1, together with the signal inverted by an inverter I1, is inputted to a level shifter LS1 to be converted into a signal for applying "H" level to a positive booster circuit output VSW and "L" level to VSS (ground). Moreover, the output thereof is converted into a signal for assigning "H" level to a voltage VSW and "L" level to a negative booster circuit output VBB, by means of a level shifter LS2. Then, the output of the level shifter LS2 is supplied to one main word line MBi via inverters I2, I3 and I4, and the output of the inverter I2 is inverted by an inverter I5 to be supplied to the other main word line Mi.

Thus, in a data read mode, the selected main word lines Mi and MBi are Mi=VSW (e.g., 4.8 V) and MBi=VBB (e.g., 0 V). On the other hand, in a data erase mode, the main word lines Mi and MBi selected as a defective row are Mi=VBB (e.g., −7.5 V) and MBi=VSW (e.g., 2.5 V). That is, the main word lines are in the "selected" state which is logic-inverted from a data read operation.

Furthermore, the row main decoder part for the redundant row cell array 602 receives only the hit signal HIT, which is outputted by the coincidence detection with the defective address in the address comparator circuit 613, the block address and VSS, in place of inputs GAi, GBi, GCi, and the construction thereof is the same.

Figure 18:
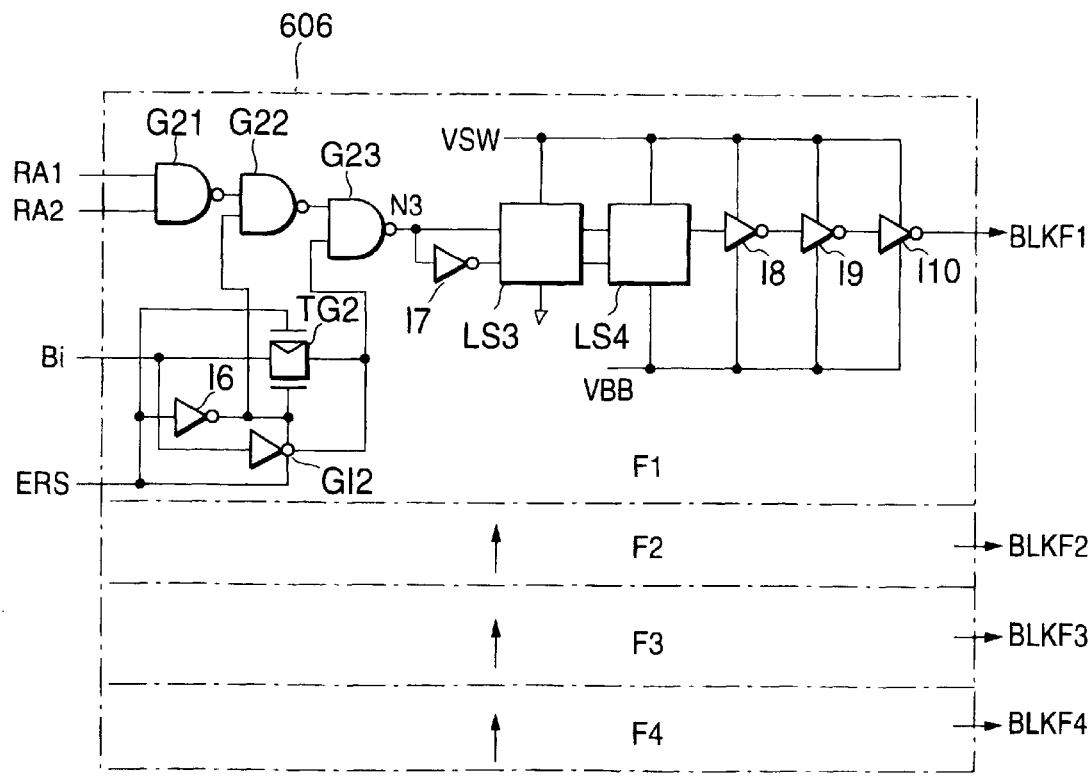
FIG. 18 is a diagram showing the construction of a word line selecting drive circuit in this preferred embodiment.

The word line selecting drive circuit 606 is formed as shown in FIG. 18. The NAND gate G21 of each of the driver F1 through F4 is a decoding gate for selecting one set of four sets of row sub-decoders 604 for eight blocks, and the output thereof has "L" in a selected state. The output of the NAND gate G21 passes through two stages of NAND gates G22, G23, two stages of level shifters LS3, LS4 and inverters I8 through I10 to generate a word line driving signal BLK.

A signal varying in accordance with the operation mode enters the control inputs of the NAND gates G22 and G23. That is, in the data read and write modes, erase control signal ERS="L", the transfer gate TG2 is ON, and the clocked inverter CI2 is OFF. At this time, the core selecting signal Bi for selecting eight blocks passes through the transfer gate TG2 to be inputted to the NAND gate G23. The core selecting signal Bi is inverted by the inverter I6 to enter the NAND gate G22. Therefore, the output node N3 of the NAND gate G23 has "L" in the read and write selected states.

The signal of the node N3 is level-converted by the level shifter LS3 into a signal having "H" level of VSW and "L" level of VSS, to be converted by the level shifter LS4 into a signal having "H" level of VSW and "L" level of VBB. Then, the level converted signal is outputted via the inverters I8 through I10, so that a selected one of the word line driving signals BLKF1 through BLKF4 has "H" (=VSW).

In the erase mode, the erase control signal ERS="H". At this time, the transfer gate TG2 is turned OFF, and the clocked inverter CI2 is turned ON. Therefore, "L" enters the NAND gate G22, and the core selecting signal Bi is inverted by the clocked inverter CI2 to be inputted to the NAND gate G23. As a result, the output node N3 of the NAND gate G23 has an inverse logic to data read and write, and has "H" in the selected state. Thus, a selected one of the word line driving signals BLKF1 through BLKF4 has "L" (=VBB).

The word line driving signals BLKF1 through BLKF4 are transferred to the row sub-decoder 604 via the transfer gate 608 which is selected by the block decoder 607. In the row sub-decoder 604, a driving voltage BLKF is applied to the selected word line WL in accordance with the potentials of the main word lines Mi and MBi.

Specifically, in the erase mode, the word lines are driven as follows. As described above, if the defective row is selected by the row main decoder 603, a pair of main word lines thereof have Mi="L" (=VBB) and MBi="H" (=VSW), and the main word lines of other rows have Mi="H" (=VSW) and MBi="L" (=VBB). On the other hand, for example, if the block BLK0 is selected, the word line selecting drive circuit 606 cause the word line driving signals to have BLKF1~BLKF4="L" (=VBB), and the block decoder 607 applies control signals BRa="H" and BRBa="L" to only the transfer gate 608a, so that the transfer gate 608a is turned on.

As a result, in the erase block BLK0, the transfer gate of the row sub-decoder 604a is turned off, and the resetting NMOS transistor QN2 is turned on, so that the defective word line has VSS (=0 V). In other word lines, the transfer gate of the row sub-decoder 604a is turned on, and the word line driving signal BLKF1 is transferred to the word line via the transfer gate 608a, so that the word line has a negative voltage VBB. Thus, a block erase operation is carried out without applying the negative voltage VBB to the defective word line. Therefore, useless pass current does not flow due to the application of the negative voltage VBB to the defective word line.

In addition, at this time, in unselected blocks, the transfer gates 608b, 608c, . . . are turned off, so that all of the word lines are set so as to have VSS regardless of the main word lines Mi and MBi.

Therefore, according to this preferred embodiment, any useless pass current paths from the booster circuit are not formed even if defects exists at different addresses every block. In addition, by storing the block address, together with the row address, as defective address information, it is possible to replace defective word lines having different addresses every block. Thus, it is possible to obtain a high relief efficiency.

Ninth Preferred Embodiment

The eighth preferred embodiment uses the decode system wherein, in the data erase operation, the defective address held in the defective address storing circuit is decoded by the main row decoder as the internal address to set the defective row in the "unselected" state. Therefore, the redundant row cell array can be substituted for one set (four word lines) in one block.

On the other hand, according to the ninth preferred embodiment, it is possible to carry out the substitution for a plurality of rows in each block.

Figure 19:
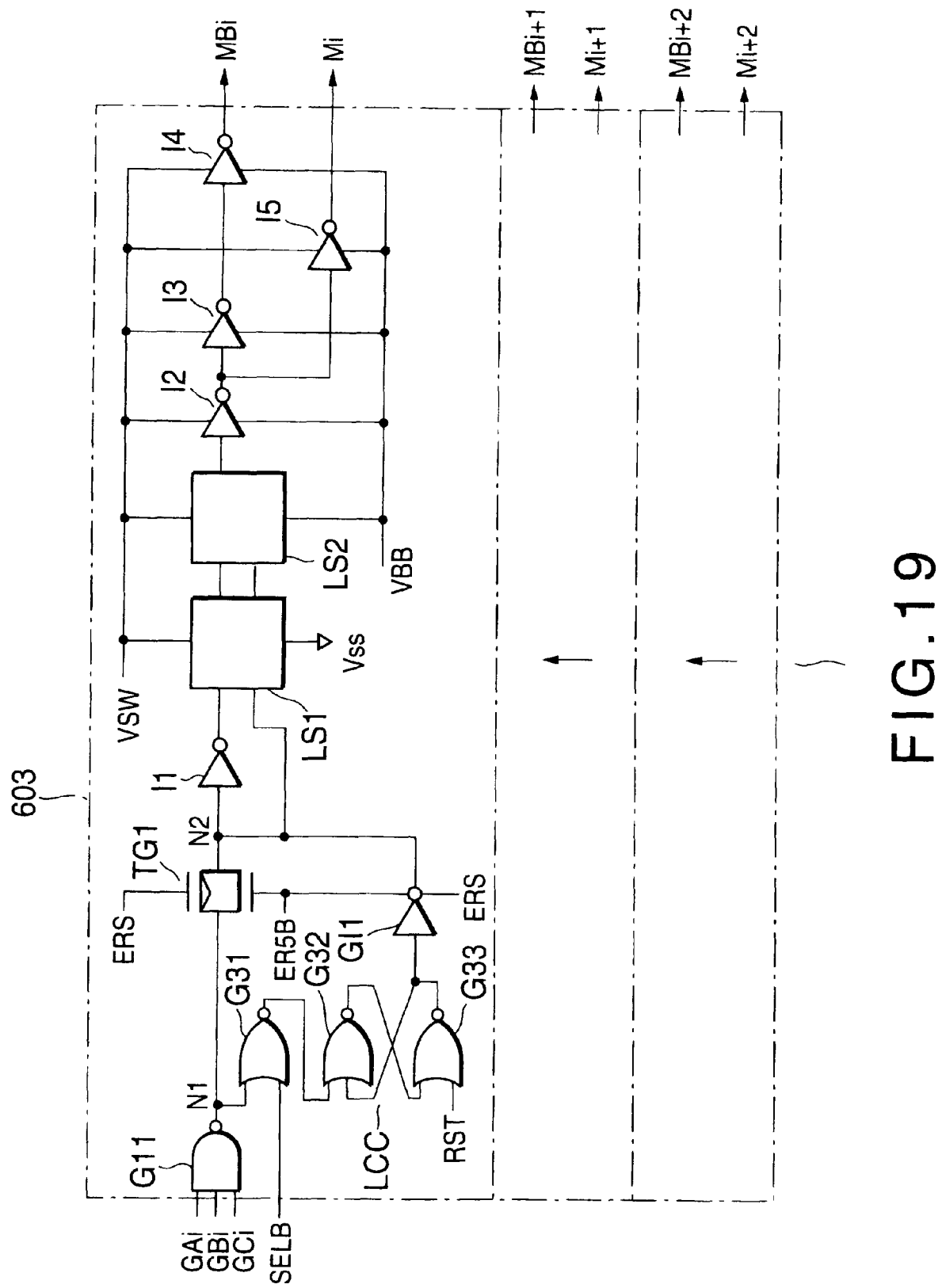
FIG. 19 is a diagram showing the construction of a row main decoder of another preferred embodiment of an EEPROM having a redundant row cell array according to the present invention.

In order to achieve this, the main row decoder 603 in the eight preferred embodiment is modified as shown in FIG. 19. As shown in this figure, the output node N1 of each decoding NAND gate G11 is provided with a NOR gage G31 controlled by a row selecting signal SELB, and there is a latch circuit (register) LCC comprising NOR gates G32 and G33 for acquiring selection information from the output of the NOR gate G31. The output of the latch circuit LCC enters a clocked inverter CI1.

In an automatic erase sequence of an EEPROM, prior to a data erase operation, data are written in an unwritten memory in a block serving as an object to be erased, and all of memory cells in the block are set in a "write state", in order to confine the threshold of the erased memory cells within a predetermined range. In this preferred embodiment, in the operation of updating all of row addresses to carry out a data write operation and a verify read operation prior to a data erase operation, "1" (="H") is set in the latch circuit LCC of the row main decoder of the selected row. That is, "H" is set in the corresponding latch circuit LCC by the selecting signal SELB="L" and the output "L" of the NAND gate G21. The fact that the row main decoder is selected means that the row is not defective. Since the defective row is replaced by the redundant row cell array in the verify read operation, the row main decoder corresponding to the defective row is not selected. Data of the latch circuit LCC of the unselected row main decoder hold "0" (="L").

In this way, in the write and verify operations prior to the data erase operation, "1" being row selecting information about non-defective rows is set in the latch circuit LCC of the row main decoder 606. Thus, similar to the preceding preferred embodiment, the main word lines Mi and MBi of the defective row can be set in the "unselected" state, i.e., Mi="L" and MBi="H", without reading and decoding the defective address of the defecting address storing circuit 612 in a data erase operation. Therefore, in this ninth preferred embodiment, it is not required to provide any address data transfer paths from the defective address storing circuit 612 to the address switching circuit 613 in the eighth preferred embodiment shown in FIG. 15.

Furthermore, the timing in setting data in the latch circuit LCC of the row main decoder 603 should not be limited to that in the write operation before the data erase operation. If there is a sequence of updating all of row addresses before a data erase operation, the setting of data in the latch circuit LCC of the row main decoder 603 can be carried out in the sequence.

Figure 20:
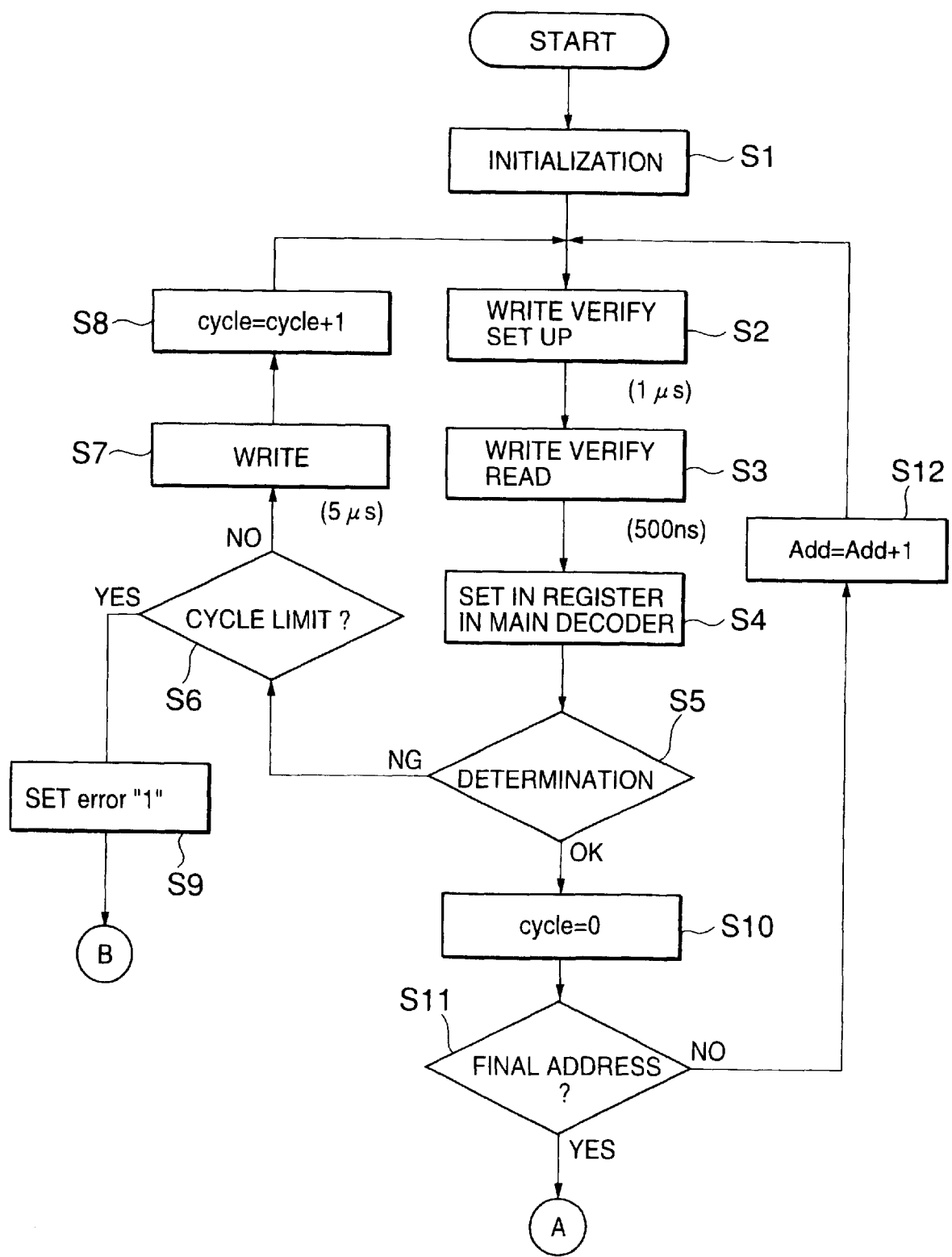
FIG. 20 is a flow chart showing the first half of a sequence of an automatic data erase operation in the preferred embodiment having the row main decoder shown in FIG. 19.
Figure 21:
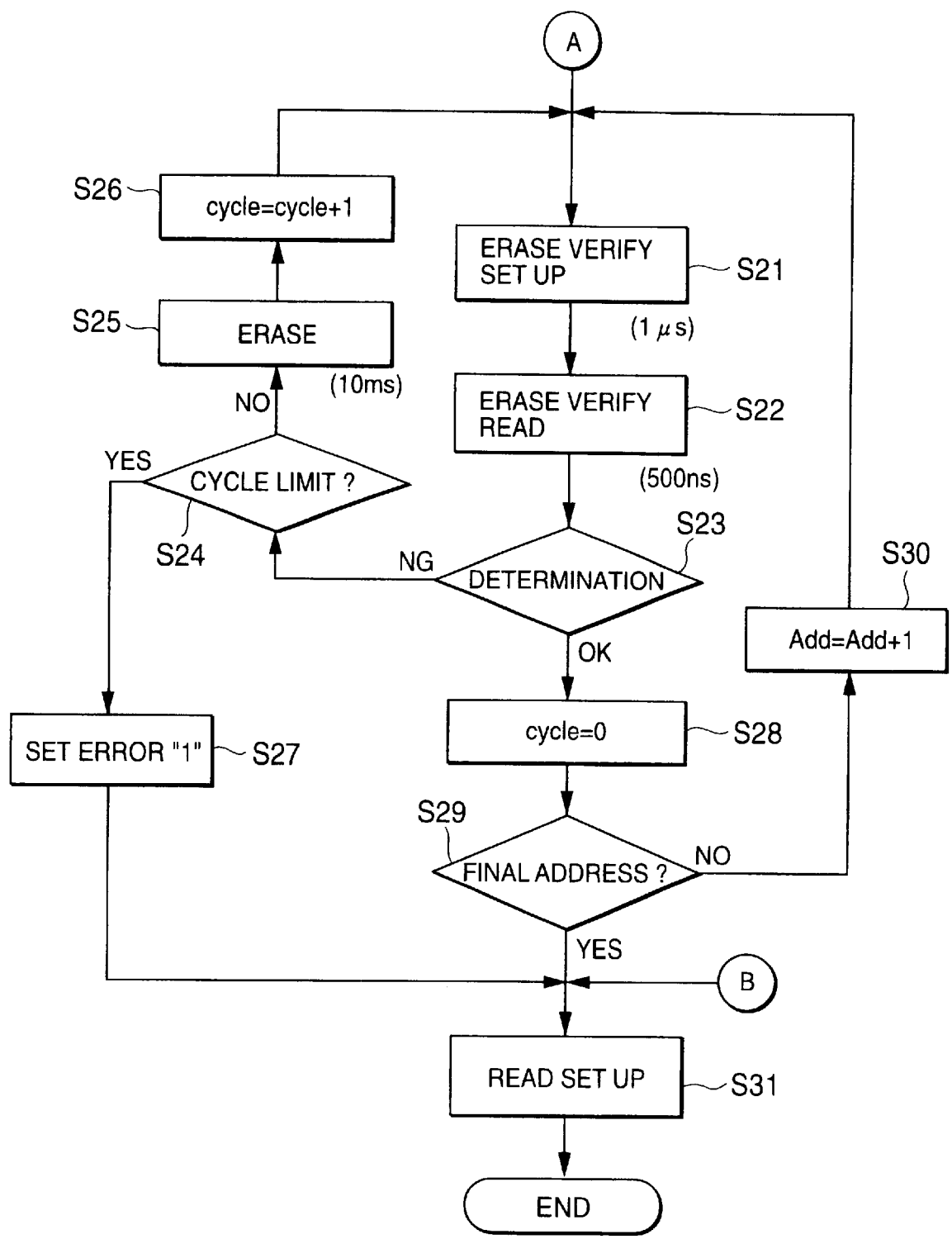
FIG. 21 is a flow chart showing the second half of the sequence.

FIGS. 20 and 21 show an automatic data erase sequence in the ninth preferred embodiment of an EEPROM according to the present invention. FIG. 20 shows a data write cycle before a data erase operation. First, initial conditions are set (S1), a write verify is set up (S2), and a write verify read operation if carried out (S3). In the latch circuit LCC of the row main register of a row address selected by the verify read operation, "1" being row selecting information is set (S4). Then, a verify determination for determining whether the write state is within a threshold range is carried out (S5).

If the determined result is NG, a cycle limit determination is carried out (S6). If the number of cycles does not reach the cycle limit, a write operation is carried out (S7), and the cycle is stepped up (S8). Then, the routine returns to step S2, so that the verify and write operations are repeated. In the determination is not OK after a predetermined cycle of write operations and if the number of cycles does not reach the cycle limit, a write error ="1" is set (S9), and the routine goes to step S30 shown in FIG. 21.

If the determination is OK at step S5, the cycle is initialized (S10), and it is determined whether the address reaches the final address (S11). If the address does not reach the final address, the address is updated (S12), and the next address write and verify operations are repeated. If the address reaches the final address, the routine goes to a data erase flow shown in FIG. 21. First, an erase verify is set up (S21), a verify read operation is carried out (S22), and it is determined whether the erase state is within a predetermined threshold range (S23). If the determined result is NG, a cycle limit determination is carried out (S24). If the number of cycles does not reach the limit, an erase operation is carried out (S25), and the cycle is stepped up (S26). Then, the routine returns to step S21, so that the verify and erase operations are repeated. If the determination is not OK after a predetermined cycle of erase operations and if the number of cycles reaches the cycle limit, an erase error="1" is set, and the routine goes to step S30.

If the determination is OK at step 23, the cycle is initialized (S28), and it is determined whether the address reached the final address (S29). If the address does not reach the final address, the address is updated (S30), and the next address erase and verify operations are repeated. If the address reaches the final address, read conditions are set up (S31), and the routine ends.

The automatic erase sequence in the eighth preferred embodiment is the same as that shown in FIGS. 20 and 21, except that step S4 in FIG. 20 is not provided.

Tenth Preferred Embodiment

Figure 22:
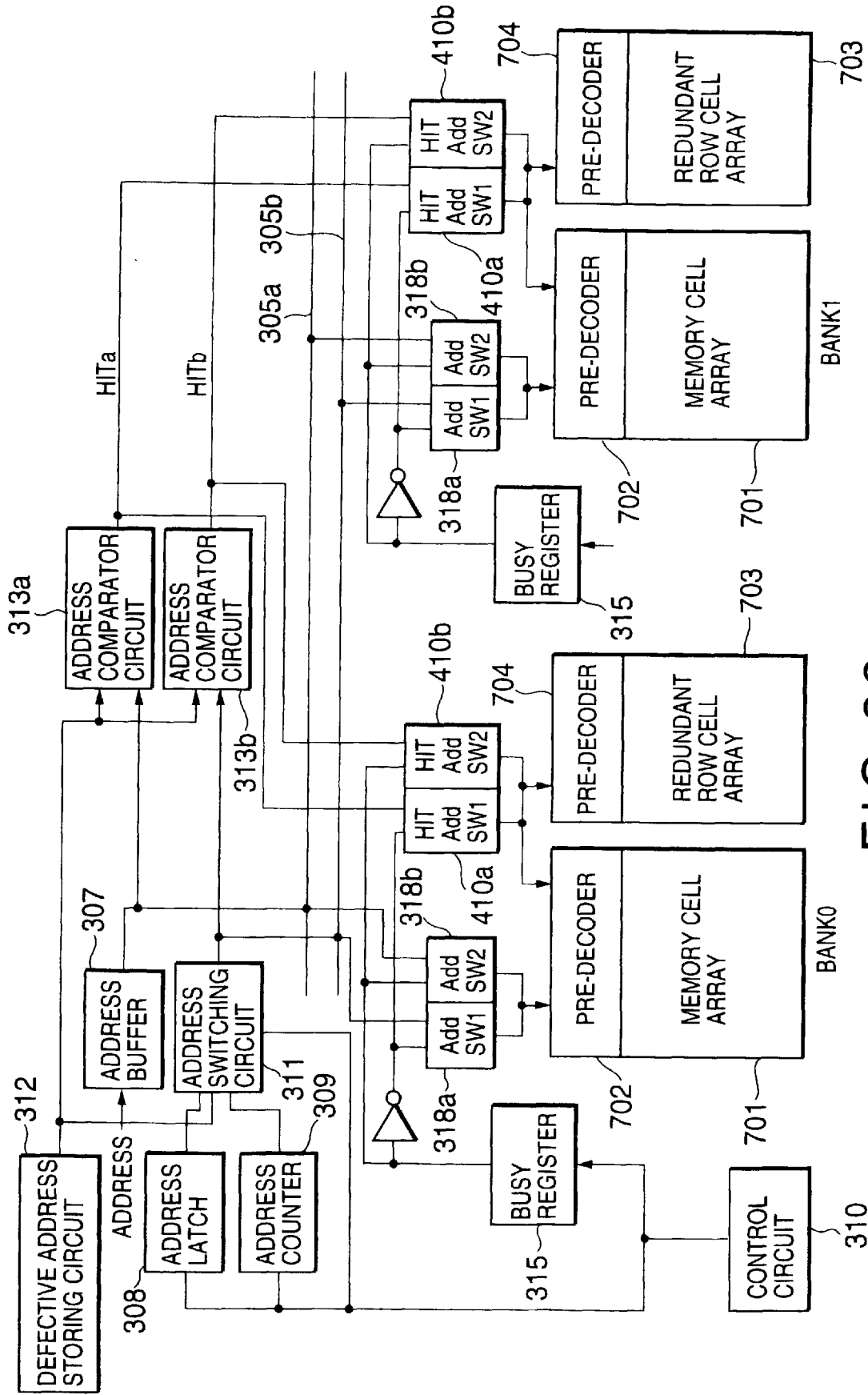
FIG. 22 is a block diagram of another preferred embodiment of an EEPROM of the RWW specification having a redundant row cell array according to the present invention.

FIG. 22 shows the whole construction of a preferred embodiment of an EEPROM of the RWW specification having a redundant row cell array according to the present invention. This figure shows the case where a memory cell array 701 is divided into two banks BANK0 and BANK1 to make it possible to carry out a data write or erase operation in one of the banks while carrying out a data read operation in the other bank. A redundant row cell array 703 is provided for the memory cell array 701 of each of the banks BANK0 and BANK1. Similar to the third preferred embodiment, the memory cell array 701 and the redundant row cell array 703 are provided with pre-decoders 702 and 703, respectively.

The fact that a reading address bus line 305a and a writing or erasing address bus line 305 are provided in parallel, that two systems of address comparator circuits 313a and 313b are provided so as to correspond thereto, that two systems of address switching circuits 318a, 318b and hit address line switching circuits 410a, 410b are provided, a busy register 315 is provided for setting one of the banks BANK0 and BANK1 in a data write or erase mode in response to a control signal from a control circuit 310, are the same as those in e.g., the preceding third preferred embodiment. The difference between this preferred embodiment and the third preferred embodiment or the like is that the defective address of the defective address storing circuit 312 is acquired and decoded as an internal address by an address switching circuit 311 in a data erase operation.

According to this preferred embodiment, in the EEPROM of the RWW specification, the relief of a defective row in a bank which is in a write or erase mode can be independent of that in a bank which is in a read mode.

Eleventh Preferred Embodiment

In general, a fuse circuit is used as the defective address storing circuit. The fuse circuits include a metal fuse circuit for fixedly storing data by mechanical cutting, and an electrically rewritable ROM fuse using nonvolatile memory cells. Although the ROM fuse circuit can be used for replacement of a defective address in the die sort process, the circuit is complicated and requires a large area. As compared with this, although the metal fuse circuit can have a small area, the circuit can no be used for replacement of a defective address in the die sort process. Therefore, if the area penalty causes a serious problem as the increase of memory capacity, the metal fuse circuit is effective.

However, as is well known, the production of the metal fuse circuit requires a fuse blow process for programming. This must be carried out by taking out a wafer (or chip) from a die sort system. For example, in order to substitute a redundant cell array for a defective address which is found in a certain die sort process, the wafer must be taken out from the die sort system. Then, it is required to carry out a fuse blow to put the wafer in the die sort system again to carry out a die sort. Therefore, in order to inspect many wafers, it is required to provide a fuse blow process every die sort, so that the total die sort time increases.

Figure 23:
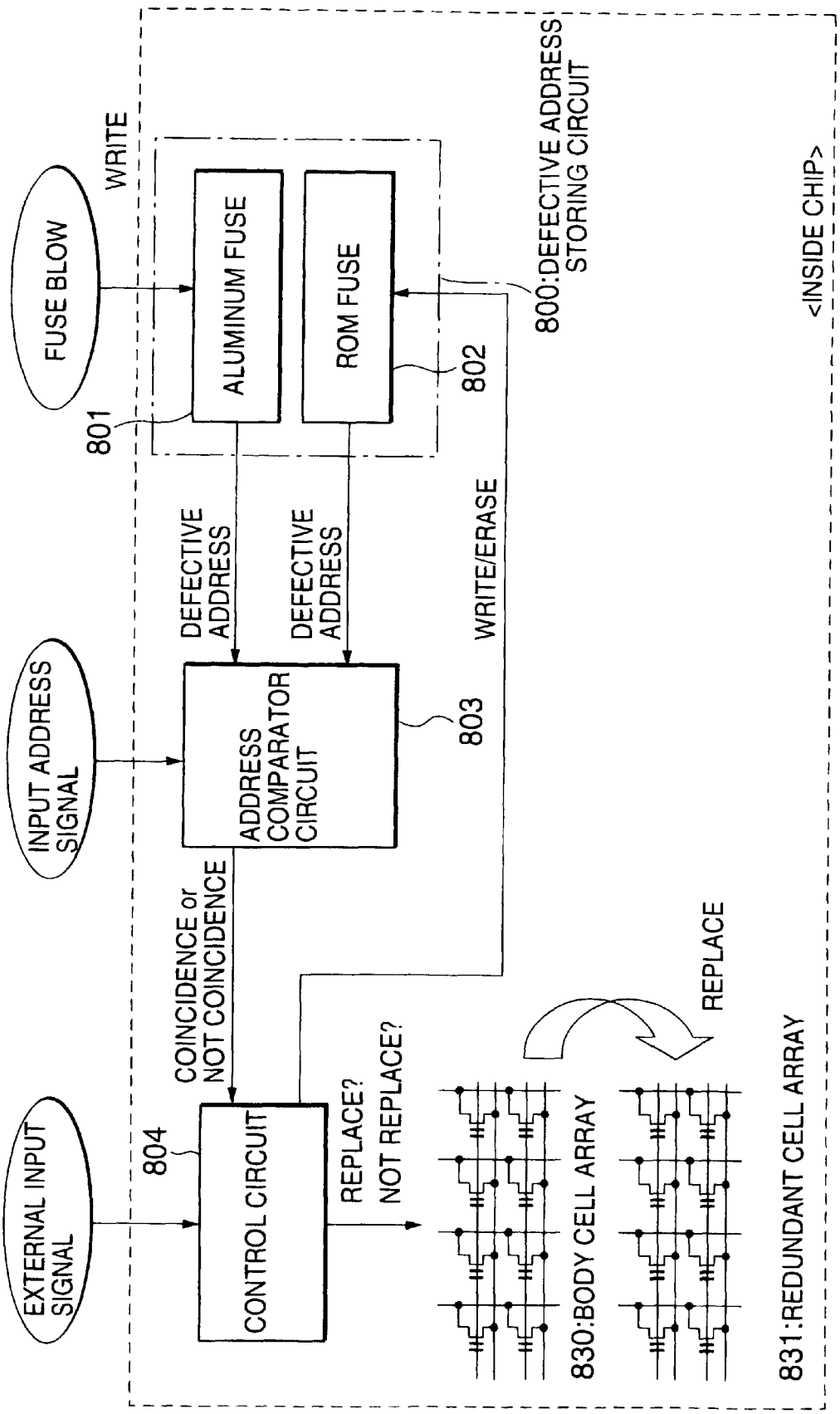
FIG. 23 is a schematic diagram showing another preferred embodiment of a semiconductor memory according to the present invention.

FIG. 23 shows the schematic chip construction of a preferred embodiment of a semiconductor memory according to the present invention, which can shorten the total die sort time in view of the foregoing. Furthermore, this preferred embodiment can not only be applied to any one of the preceding preferred embodiments of an EEPROM according to the present invention, but it can also be applied to any one of other semiconductor memories, such as DRAMs and SRAMs.

FIG. 23 shows only a circuit part required to substitute a redundant cell array 831 for a body cell array 830 in a memory chip. There are provided a defective address storing circuit 800, an address comparator circuit 803 for detecting the coincidence of an input address with a defective address stored in the defective address storing circuit 800, and a control circuit 804 for carrying out an address substitution control by a coincident detection output.

The defective address storing circuit 800 has a ROM fuse circuit 802 in addition to an aluminum fuse circuit 801 using an aluminum fuse as a metal fuse. As is well known, the aluminum fuse circuit 801 is designed to fixedly store a defective address by mechanical cutting due to the fuse blow. On the other hand, since the ROM fuse circuit 802 can rewrite data and erase data, the ROM fuse circuit 802 is usable not only as a circuit for fixedly storing a defective address, but also as a temporary storage circuit for temporarily writing and holding a defective address found by the die sort. The ROM fuse circuit 802 has a capacity sufficient for storing a suitable plurality of addresses. The write/erase operation of this ROM fuse circuit 802 can be carried out by the control circuit 804 while holding the wafer (or chip) in the die sort system.

Figure 24:
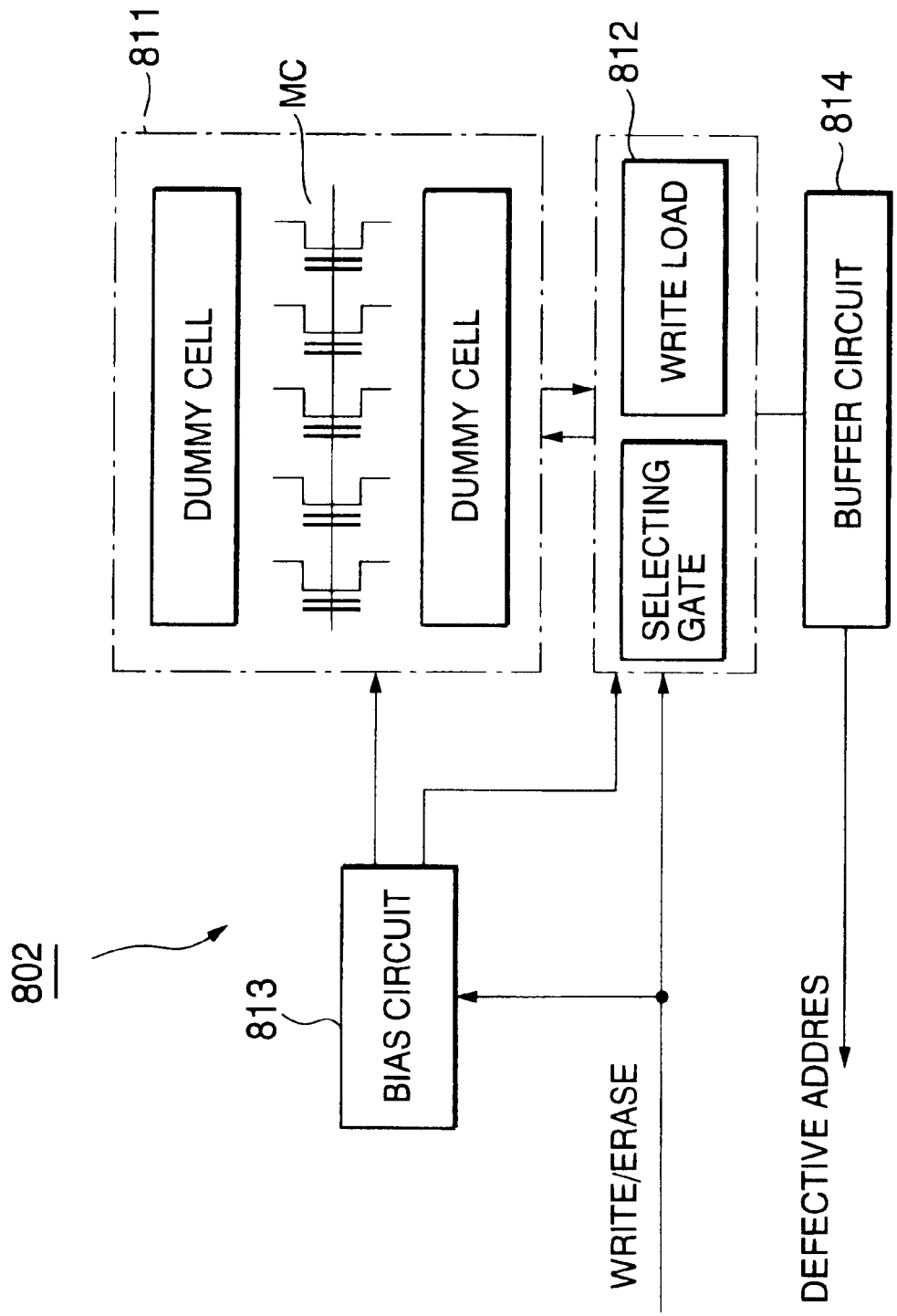
FIG. 24 is a block diagram of a ROM fuse circuit in this preferred embodiment.

As shown in FIG. 24, the ROM fuse circuit 802 has a ROM fuse array 811 comprising electrically rewritable nonvolatile memory cells MC which are the same as the memory cells of the body cell array 830. Since the capacity of the ROM fuse array 811 is far smaller than that of the body cell array 830, dummy cells for insuring the regularity of the pattern are arranged so as to obtain the same processing conditions as those for the body cell array 830. In order to control the write/erase in the ROM fuse array 811 by means of the control circuit 804, a bias circuit 813 for generating a high voltage or the like is provided. In addition, a switching circuit 812 including a selecting gate and a write load is provided. The defective address selected by the switching circuit 812 is outputted via a buffer circuit 814.

Figure 25:
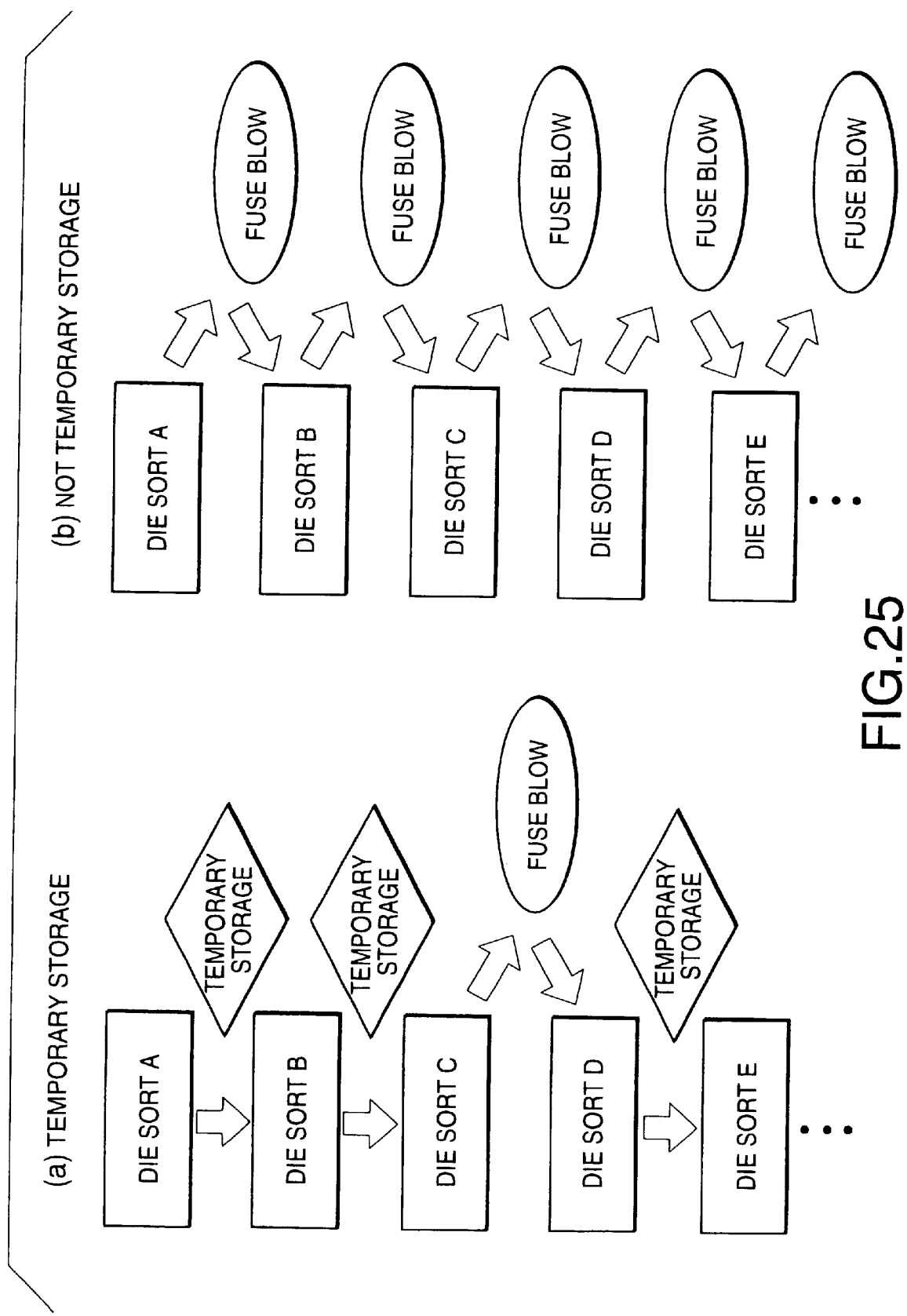
FIG. 25 is a diagram showing a die sort flow in this preferred embodiment, as compared with that in a conventional case.

Referring to FIG. 25, as comparing with a conventional case, a die sort flow in this preferred embodiment will be described below. FIG. 25(b) shows a conventional case where a defective address storing circuit consists of a fuse circuit. In this case, after a die sort A ends, a defective address found herein is stored in the defective address storing circuit by taking out a wafer (or chip) from a die sort system to carry out a fuse blow. Then, the wafer (or chip) is put in the die sort system again to carry out a die sort B. After the die sort B ends, a defective address sound herein is stored in the defective address storing circuit by taking out the wafer (or chip) from the die sort system to carry out a fuse blow. Then, the same operation is repeated.

On the other hand, FIG. 25(a) shows a preferred embodiment wherein a ROM fuse circuit 802 is provided. When a die sort A ends, a defective address found herein is temporarily written to the ROM fuse circuit 802 and replaced. If the replacement of a defective address in a block address to be tested by using the ROM fuse circuit 802 is performed, it is possible to perform tests assuming that the defective address has been replaced by using the aluminum fuse circuit 801. Since this defective address write operation can be carried out by inputting an electric signal from the outside, the operation can be carried out while the wafer (or chip) is put in the die sort system. However, the defective address is stored in a fail memory in tester at any time. Because it is difficult to store all the defective addresses in the ROM fuse circuit 802 in view of capacity thereof. Therefore, only the defective address in a block to be tested is replaced by using the ROM fuse circuit 802. Then, the ROM fuse circuit 802 and the address comparator circuit 803 carry out the substitution control of the defective address to carry out the next die sort B. The defective address found by the die sort B is also temporarily written and held in the ROM fuse circuit 800 and the test process proceed temporarily replacing.

FIG. 25(a) shows an example where the defective addresses temporarily held in the die sorts A through C are batch-transferred to the aluminum fuse circuit 801 to carry out a fuse blow after the die sort C is carried out. That is, at this stage, the wafer (or chip) is taken out from the die sort system, and the defective addresses held in the fail memory in tester and/or the ROM fuse circuit 802 are read out to carry out the fuse blow of the defective address. Thereafter, the ROM fuse circuit 802 is reset, and a die sort is carried out in the same sequence.

If the capacity of the ROM fuse circuit 802 is sufficient, one programming has only to be carried out with respect to the aluminum fuse circuit 801 after all of die sorts are completed.

As described above, according to this preferred embodiment, the fuse blows can be simultaneously carried out after the plurality of die sorts, so that it is possible to reduce the number of fuse blow processes. Since the wafer (or chip) must be taken out from the die sort system in order to carry out the fuse blow, the reduction of the number of fuse blow processes can greatly shorten the total die sort time.

(Twelfth Preferred Embodiment)

Figure 26:
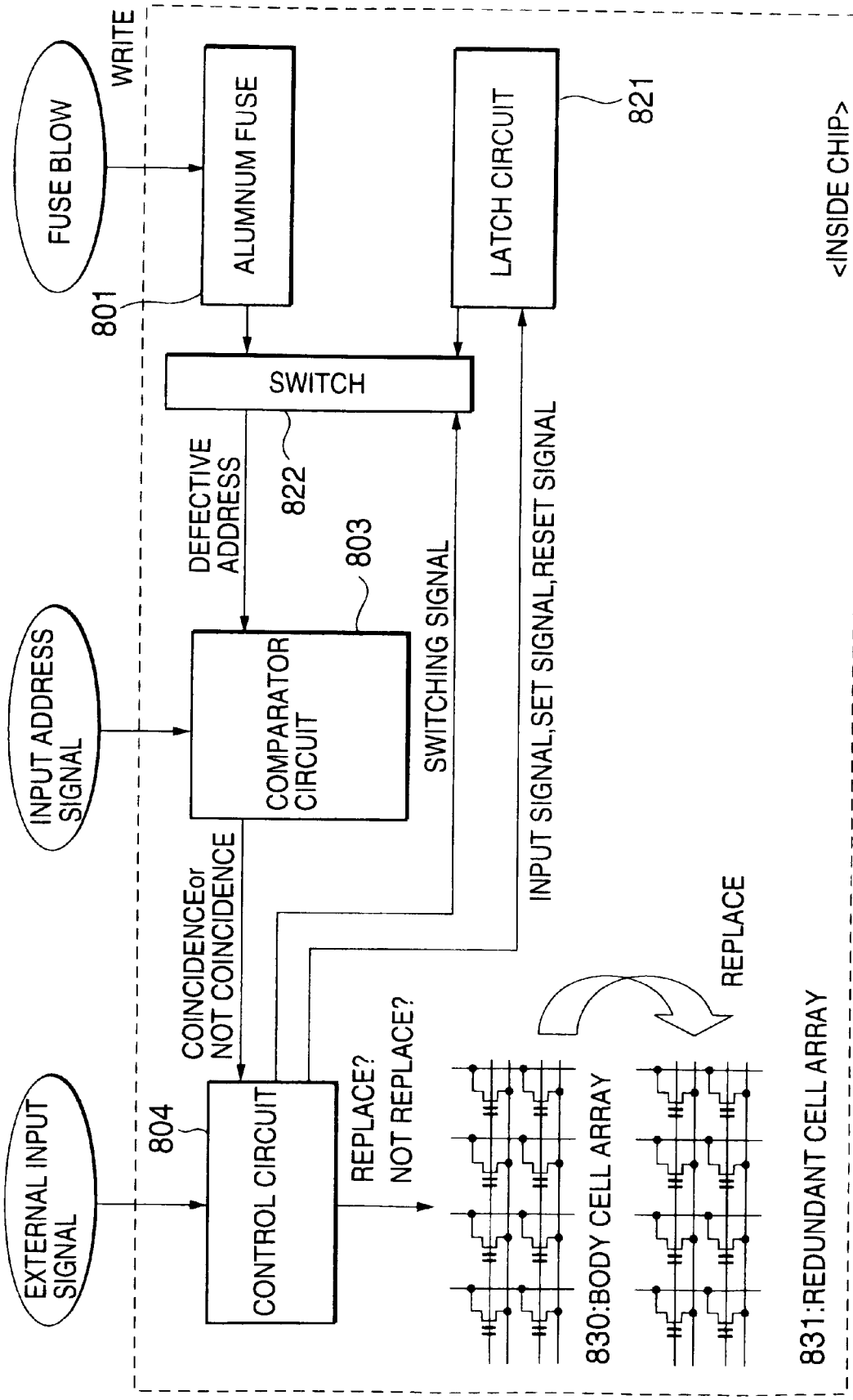
FIG. 26 is a schematic diagram showing another preferred embodiment of a semiconductor memory according to the present invention.
Figure 27:
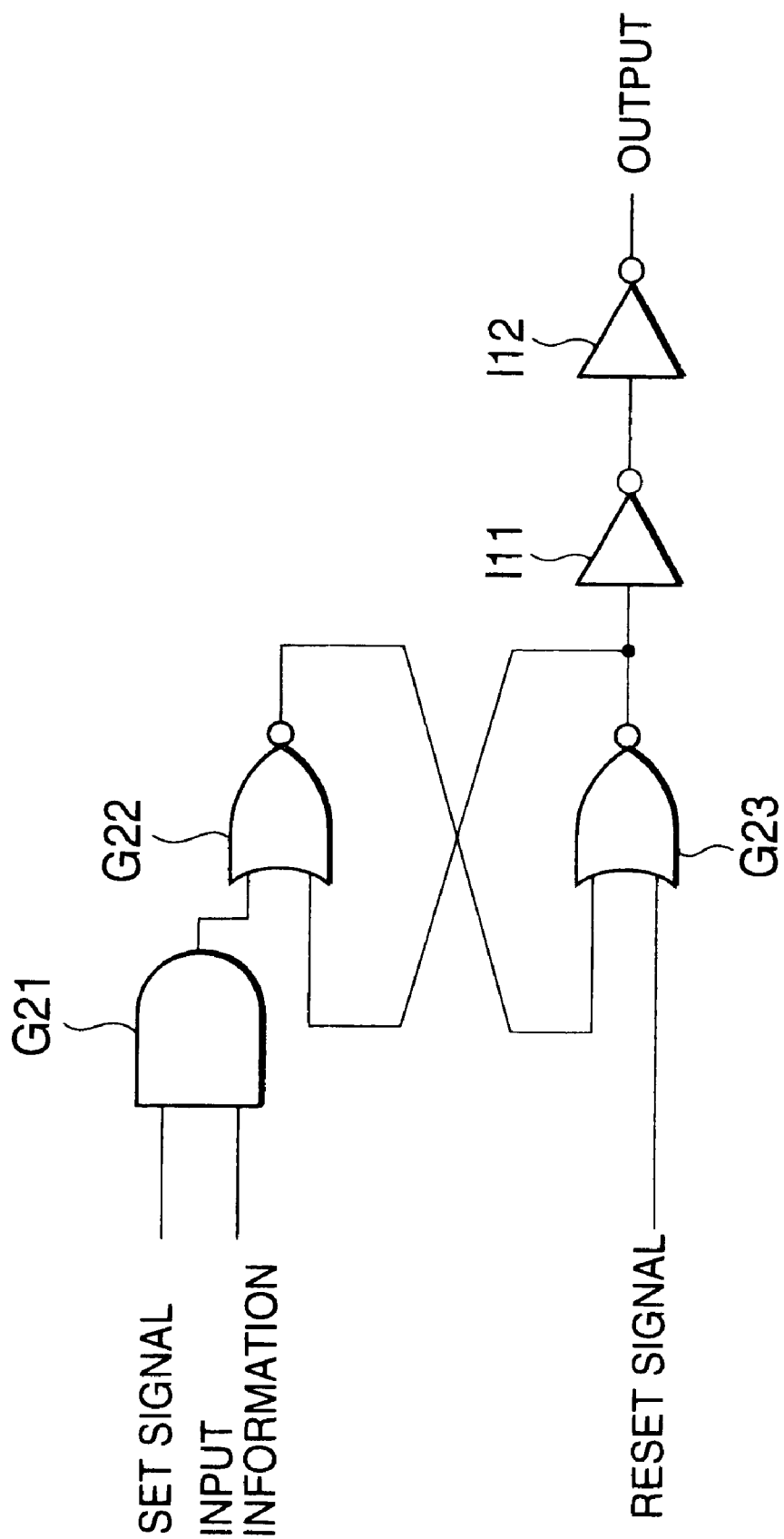
FIG. 27 is a diagram showing the construction of a latch for use in this preferred embodiment.

FIG. 26 shows a preferred embodiment where a latch circuit 821 is substituted for the ROM fuse circuit 802 in the preferred embodiment shown in FIG. 23. The latch circuit 821 comprises well-known latches which are shown in FIG. 27 and the number of which is sufficient to store required address information. The defective address held in the latch circuit 821 and the address held in the aluminum fuse circuit 801 are designed to be selectively fed to the defective address comparator circuit 803 by means of a switch 822.

The die sort flow in this preferred embodiment is the same as that in FIG. 25(*a*), and the defective address found in the die sort A is temporarily stored in the latch circuit 821 and also stored in the fail memory in the tester. Furthermore, by replacing the defective address in the block to be tested by using the latch circuit 821, it is possible to test assuming that the defective address has been replaced by using the aluminum fuse circuit 801. In the next die sort B, the switch 822 is controlled so that the defective address held in the latch circuit 821 enters the comparator circuit 803. Thus, the defective address found in the die sort A is replaced to carry out the die sort B. Then, the defective addresses held in the latch circuit 821 by a plurality or all of dies sorts are simultaneously written in the fuse circuit 801.

Also according to this preferred embodiment, the total die sort time can be shortened due to the reduction of the number of fuse blow processes. Although the data of the latch circuit is volatile, there are advantages in that the latch circuit does not require any circuit parts required to control write/erase unlike the ROM fuse circuit 802, and has a simple circuit construction and a small area penalty. In addition, the latch circuit can be utilized for uses other than the temporary holding of the defective addresses.

As described above, according to the present invention, the redundant sense amplifier circuit is provided for each of the redundant column cell arrays of the plurality of columns. In addition, normal cell array data and redundant cell array data are designed to be simultaneously read out in a data read operation, so that the sense amplifier switching circuit and the data switching circuit carry out the replacement of defective data corresponding to a defective address. Thus, it is possible to efficiently relieve a plurality of defective columns. In particular, this system is effectively applied to an EEPROM of the RWW specification wherein address bus lines and data bus lines are provided commonly for a plurality of banks.

In addition, according to the present invention, the redundant cell array block is arranged in each of banks, so that it is possible to obtain an EEPROM of the RWW specification wherein the control of the substitution for defective address every block in a bank, in which a data read operation is being carried out, is independent of that in a bank, in which a data write or erase operation is being carried out.

Moreover, according to the present invention, the redundant row cell array is provided. In addition, in a data erase mode, 0 V is applied to defective word lines and a negative voltage is applied to other word lines. Thus, it is possible to obtain an EEPROM capable of carrying out an efficient row defect relief without forming any useless pass current paths.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory comprising:
   a memory cell array having electrically rewritable memory cells;
   a plurality of redundant column cell arrays for relieving a defective memory cell in said memory cell array;
   a decoding circuit for selecting a memory cell of said memory cell array;
   a plurality of sense amplifier circuits for detecting read data of said memory cell array and for latching write data;
   data input/output buffers provided between each of said sense amplifier circuits and a corresponding one of data input/output terminals;
   a defective address storing circuit for storing a defective address of said memory cell array, an input/output terminal to and from which data corresponding to said defective address are inputted and outputted, and a set number for identifying one of said plurality of redundant column cell arrays, which is to be substituted so as to correspond to said input/output terminal;
   a plurality of redundant sense amplifier circuits for detecting read data of said plurality of redundant column cell arrays and for latching write data;
   an address comparator circuit for outputting a coincidence detection signal when an input address is coincident with said defective address held in said defective address storing circuit; and
   a switching circuit which is controlled by said coincidence detection signal for selectively connecting one of said sense amplifier corresponding to said defective address in said plurality of sense amplifier circuits or one of said redundant sense amplifier circuits identified by said set number in said plurality of redundant sense amplifier circuit, to said data input/output buffer in place of one of said sense amplifier circuits corresponding to said defective address,
      wherein said switching circuit comprises a sense amplifier switching circuit, and a plurality of data switching circuits provided so as to correspond to said plurality of sense amplifier circuit;
      said sense amplifier switching circuit selectively connects one of said plurality of redundant sense amplifier circuits to said plurality of data switching circuits via one bus line; and
      said plurality of data switching circuit selectively connects one of a corresponding one of said sense amplifier circuits and said sense amplifier switching circuit to said data input/output buffer.

2. The semiconductor memory as set forth in claim 1, which further comprises:
   a first control circuit for outputting a first switching signal for switching said sense amplifier switching circuit, and for causing said sense amplifier switching circuit to select one of said redundant sense amplifier circuits corresponding to said redundant cell array identified by said set number, when said address comparator circuit detects that said input address is coincident with said defective address held in said defective address storing circuit; and a second control circuit for outputting a second switching signal for individually switching said plurality of data switching circuits, and for causing one of said plurality of said data switching circuits corresponding to said defective address to select said sense amplifier switching circuit, when said address comparator circuit detects that said input address is coincident with said defective address held in said defective address storing circuit.

3. The semiconductor memory as set forth in claim 1, wherein said defective address storing circuit comprises:

an electrically storage circuit for electrically holding a defective address found in a certain defect inspecting process; and a fixed storage circuit for fixedly storing at least part of said defective address which is transferred to said fixed storage circuit after a plurality of defect inspecting processes.

4. A nonvolatile semiconductor memory comprising:

a memory cell array having electrically rewritable memory cells, said memory cell array being divided into a plurality of banks so that while a data write or erase operation is carried out in one of the banks, a data read operation can be carried out in one of the others of the banks;

at least one redundant column cell array provided in each of said banks for relieving a defective memory cell of said memory cell array;

a decoding circuit provided in each of said banks;

a first address bus line for data reading, which is provided commonly for each of said banks;

a second address bus line for data writing or erasing, which is provided commonly for each of said banks;

a first data bus line for data reading, which is provided commonly for each of said banks;

a second data bus line for data writing or erasing, which is provided commonly for each of said banks;

a plurality of first sense amplifier circuits, connected to said first data bus line, for detecting and amplifying read data of said memory cell array in parallel;

a plurality of second sense amplifier circuits, connected to said second data bus line, for detecting and amplifying verify read data of said memory cell array in parallel;

a busy signal circuit, provided in each of said banks, for outputting a busy signal indicating whether an assigned bank is selected as the data write or erase operation or the read operation, said busy signal being used for controlling the selective connection of said first and second address bus lines and for controlling the selective connection of said first and second data bus lines;

a defective address storing circuit for storing a defective address of said memory cell array and an input/output terminal, to and from which data corresponding to said defective address are inputted and outputted;

a first redundant sense amplifier circuit which is provided so as to correspond to said redundant column cell array and which is connected to said first data bus line for detecting and amplifying read data of said redundant column cell array;

a second redundant sense amplifier circuit which is provided so as to correspond to said redundant column cell array and which is connected to said second data bus line for detecting and amplifying verify read data of said redundant column cell array;

a first address comparator circuit for detecting the coincidence of an address, which is supplied to said first address bus line in the data read operation, with said defective address held in said defective address storing circuit;

a second address comparator circuit for detecting the coincidence of an address, which is supplied to said second address bus line in the data write or erase operation, with said defective address held in said defective address storing circuit;

a first switching circuit for replacing a part of the output of said plurality of first sense amplifier circuits with the output of said first redundant sense amplifier circuit, on the basis of a coincidence detection output of said first address comparator circuit; and a second switching circuit for replacing a part of the output of said plurality of second sense amplifier circuits with the output of said second redundant sense amplifier circuit, on the basis of a coincidence detection output of said second address comparator circuit.

5. The nonvolatile semiconductor memory as set forth in claim 4, wherein one redundant column cell array, which is the same as said redundant column cell array, is provided in each of said banks.

6. The nonvolatile semiconductor memory as set forth in claim 4, wherein a plurality of redundant column cell arrays, each of which is the same as said redundant column cell array, are provided in each of said banks;

said first switching circuit comprises a single first sense amplifier, and a plurality of first data switching circuits provided so as to correspond to said plurality of first sense amplifier circuits;

said first sense amplifier switching circuit selectively connects one of said plurality of first redundant sense amplifier circuits to said plurality of first data switching circuits;

said plurality of first data switching circuits selectively connects one of a corresponding one of said plurality of sense amplifier circuits and said first sense amplifier switching circuit to a data buffer;

said second switching circuit comprises a single second sense amplifier switching circuit, and a plurality of second data switching circuit provided so as to correspond to said plurality of second sense amplifier circuits;

said second sense amplifier switching circuit selectively connects one of said plurality of second redundant sense amplifier circuit to said plurality of second data switching circuits; and said plurality of second data switching circuit selectively connects one of a corresponding one of said plurality of second data switching circuits and said second sense amplifier switching circuit to a determining circuit.

7. The nonvolatile semiconductor memory as set forth in claim 4, wherein said defective address storing circuit comprises:

an electrically storage circuit for electrically holding a defective address found in a certain defect inspecting process; and a fixed storage circuit for fixedly storing at least part of said defective address which is transferred to said fixed storage circuit after a plurality of defect inspecting processes.

8. A nonvolatile semiconductor memory comprising:

a memory cell array having electrically rewritable memory cells, said memory cell array being divided into a plurality of banks so that while a data write or erase operation is carried out in one of the banks, a data read operation can be carried out in one of the others of the banks;

a redundant cell array block provided in each of said banks for relieving a defective memory cell of said memory cell array;

decoding circuits provided in said memory cell array and said redundant cell array block in each of said banks respectively;

a first address bus line for data reading, which is provided commonly for each of said banks;

a second address bus line for data writing or erasing, which is provided commonly for each of said banks;

a busy signal circuit, provided in each of said banks, for outputting a busy signal indicating whether an assigned bank is selected as the data write or erase operation or the read operation;

an address line switching circuit for connecting one of said first and second address bus lines to said memory array and redundant cell array block of each of said banks, in accordance with said busy signal;

a defective block address storing circuit for storing a defective block address of said memory cell array;

a first address comparator circuit for comparing an address, which is supplied to said first address bus line, with said defective block address, which has been held in said defective address storing circuit, in the data read operation to output a first coincidence detection signal when both are coincident with each other;

a second address comparator circuit for comparing an address, which is supplied to said second address bus line, with said defective block address, which has been held in said defective address storing circuit, in the data write or erase operation to output a second coincidence detection signal when both are coincident with each other; and a hit address switching circuit for causing one of said memory cell array and said redundant cell array block to be active and the other to be inactive, in accordance with said first and second coincident detection signals, in each of said banks.

9. The nonvolatile semiconductor memory as set forth in claim 8, wherein said memory cell array of each of said banks comprises a plurality of cores, each of which comprises a set of blocks, each of which is the minimum unit for the data erase operation, and said redundant cell array block of each of said banks comprises one core or a plurality of cores; and which further comprises core decoders, connected to said first and second address bus lines, respectively, for selecting cores on the basis of core addresses inputted from said first and second address bus lines, and for controlling the activity and inactivity of said decoding circuits in each of said banks on the basis of the outputs thereof.

10. The nonvolatile semiconductor memory as set forth in claim 9, wherein said defective address storing circuit stores said defective block addresses, and core addresses of spare blocks, which are to be substituted for blocks of said defective block addresses;

said core decoders decodes a corresponding one of said core addresses of said spare block when one of said defective addresses is detected; and said defective blocks of a certain core in each of said banks are able to be replaced with one of said spare blocks of an optional core.

11. The nonvolatile semiconductor memory as set forth in claim 8, wherein at least one of said plurality of banks has a capacity which is different from that of the other of said plurality of banks, and the capacity ratio of said redundant cell array block to said memory cell array in one of said banks having a smaller capacity is set to be greater than the capacity ratio of said redundant cell array block to said memory cell array in the other of said banks having a greater capacity.

12. The nonvolatile semiconductor memory as set forth in claim 8, wherein said defective address storing circuit comprises:

an electrically storage circuit for electrically holding a defective block address found in a certain defect inspecting process; and a fixed storage circuit for fixedly storing at least part of said defective block address which is transferred to said fixed storage circuit after a plurality of defect inspecting processes.

13. A nonvolatile semiconductor memory comprising:

a memory cell array having electrically rewritable memory cells, said memory cell array being divided into a plurality of banks so that while a data write or erase operation is carried out in one of the banks, a data read operation can be carried out in one of the others of the banks, each of said banks having a plurality of cores, each of said cores comprising a set of blocks, each of which is the minimum unit for the data erase operation;

a redundant cell array block, which has one or more cores provided independently of each of said banks, for relieving a defective memory cell of said memory cell array;

a first decoding circuit provided in said memory cell array in each of said banks;

a second decoding circuit provided in said redundant cell array block;

a first address bus line for data reading, which is provided commonly for each of said banks;

a second address bus line for data writing or erasing, which is provided commonly for each of said banks;

a busy signal circuit, provided in each of said banks, for outputting a busy signal indicating whether an assigned bank is selected as the data write or erase operation or the read operation;

a first address line switching circuit, provided in each of said banks, for connecting one of said first and second address bus lines to said memory array of each of said banks, in accordance with said busy signal;

a second address line switching circuit, provided in said redundant cell array block, for connecting said first and second address bus lines to said redundant cell array block;

a defective address storing circuit for storing a defective block address of said memory cell array;

a first address comparator circuit for comparing an address, which is supplied to said first address bus line, with said defective block address, which has been held in said defective address storing circuit, in the data read operation to output a first coincidence detection signal when both are coincidence with each other;

a second address comparator circuit for comparing an address, which is supplied to said second address bus line, with said defective block address, which has been held in said defective address storing circuit, in the data write or erase operation to output a second coincidence detection signal when both are coincidence with each other;

a first core decoder, which is provided in each of said banks and which is activated when said first and second address comparator circuits do not output said first or second coincidence detection signal, for decoding a core address of addresses, which are supplied to said first and second address bus line, to supply the decoded core address to said memory cell array;

a core switching circuit for selecting an output of said first core decoder in accordance with said busy signal outputted from said busy signal circuit, to supply the selected output to said memory cell array; and a second core decoder, which is provided in said redundant cell array block and which is activated when said first or second address comparator circuit outputs said first or second coincidence detection signal, for decoding a core address of addresses, which are supplied to said first or second address bus lines, to supply the decoded core address to said redundant cell array block.

14. A semiconductor memory comprising:

a memory cell array having electrically rewritable memory cells, said memory cell array also comprising a plurality of blocks, each of which defines a range of memory cells serving as the minimum unit for data erase;

a redundant cell array for relieving a defective memory cell of said memory cell array;

a decoding circuit for selecting a memory cell of said memory cell array;

a defective address storing circuit for storing a defective address of said memory cell array; and an address comparator circuit for detecting the coincidence of an input address with said defective address which has been held in said defective address storing circuit, wherein a defective row of said memory cell array is replaced with said redundant cell array, and said decoding circuit has a row decoder for supplying 0 V to a defective word line, which is a word line corresponding to said defective address, of a block to be erased in a data erase operation, a negative voltage to other word lines, and 0 V to all of word lines in blocks other than said block to be erased, to allow said defective word line to be replaced every block of said memory cell array.

15. The semiconductor memory as set forth in claim 14, wherein said defective address storing circuit stores a defective row address identifying a defective word line, and a block address;

in a data read operation, said row decoder is controlled by an output of said address comparator circuit so that said memory cell array is inactive and said redundant cell array is active; and in a data erase operation, said row decoder decodes said defective row address and block address, which are read out from said defective address storing circuit, to apply 0 V to said defective word line of the selected block to be erased, and a negative voltage to other word lines.

16. The semiconductor memory as set forth in claim 14, wherein said row decoder has a latch circuit in each row, and a latch circuit of a non-defective row latches selection information by the selection of all of row addresses prior to a data erase operation, and in a data erase operation, a negative voltage is applied to a word line of said non-defective row on the basis of said selection information of said latch circuit, and 0 V is applied to a word line of a defective row.

17. A semiconductor memory comprising:

a memory cell array;

a redundant cell array for relieving a defective cell of said memory cell array;

a defective address storing circuit for storing a defective address of said memory cell array; and an address comparator circuit for detecting the coincidence of an input address with said defective address, which has been held in said defective address storage circuit, to replace said defective cell of said memory cell array with said redundant cell array, and wherein said defective address storing circuit comprises:

an electrically storage circuit for electrically holding a defective address found in a certain defect inspecting process; and a fixed storage circuit for fixedly storing at least part of said defective address which is transferred to said fixed storage circuit after a plurality of defect inspecting processes.

18. The semiconductor memory as set forth in claim 17, wherein said electrically storage circuit comprises an electrically rewritable nonvolatile memory cell.

19. The semiconductor memory as set forth in claim 17, wherein said electrically storage circuit comprises a latch circuit.

* * * * *